US009466629B2

(12) United States Patent
Yoon et al.

(10) Patent No.: US 9,466,629 B2
(45) Date of Patent: Oct. 11, 2016

(54) IMAGE SENSOR AND METHOD OF FABRICATING THE SAME

(71) Applicants: Junho Yoon, Seoul (KR); Sunwoo Park, Hwaseong-si (KR); Chungho Song, Uiwang-si (KR); Heegeun Jeong, Suwon-si (KR)

(72) Inventors: Junho Yoon, Seoul (KR); Sunwoo Park, Hwaseong-si (KR); Chungho Song, Uiwang-si (KR); Heegeun Jeong, Suwon-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 14/747,225

(22) Filed: Jun. 23, 2015

(65) Prior Publication Data
US 2015/0372031 A1    Dec. 24, 2015

(30) Foreign Application Priority Data
Jun. 23, 2014   (KR) .......................... 10-2014-0076512

(51) Int. Cl.
*H01L 27/146*    (2006.01)
(52) U.S. Cl.
CPC ....... *H01L 27/1463* (2013.01); *H01L 27/1464* (2013.01); *H01L 27/14603* (2013.01); *H01L 27/14614* (2013.01); *H01L 27/14685* (2013.01); *H01L 27/14689* (2013.01)
(58) Field of Classification Search
CPC ............ H01L 27/1463; H01L 27/14603; H01L 27/14614; H01L 27/14685; H01L 27/14689
See application file for complete search history.

(56) References Cited

U.S. PATENT DOCUMENTS

| | | | |
|---|---|---|---|
| 6,815,827 B2 | 11/2004 | Vieux-Rochaz et al. | |
| 7,400,004 B2 | 7/2008 | Cole et al. | |
| 7,518,172 B2 | 4/2009 | Moon et al. | |
| 7,595,213 B2 | 9/2009 | Kwon et al. | |
| 8,389,377 B2 | 3/2013 | Hsiao et al. | |
| 8,390,089 B2 | 3/2013 | Chen et al. | |
| 8,513,762 B2 | 8/2013 | Qian et al. | |
| 8,587,081 B2 | 11/2013 | Chao | |
| 2007/0194356 A1* | 8/2007 | Moon | H01L 27/14625 257/291 |
| 2009/0200625 A1* | 8/2009 | Venezia | H01L 27/1463 257/432 |
| 2009/0315137 A1 | 12/2009 | Kwon et al. | |
| 2010/0006908 A1 | 1/2010 | Brady | |
| 2012/0153127 A1* | 6/2012 | Hirigoyen | H01L 27/14609 250/208.1 |
| 2013/0034929 A1 | 2/2013 | Su et al. | |
| 2013/0285130 A1 | 10/2013 | Ting et al. | |
| 2013/0320479 A1* | 12/2013 | Ahn | H01L 31/02 247/460 |
| 2014/0035083 A1* | 2/2014 | Wan | H01L 27/14634 257/432 |
| 2015/0372034 A1* | 12/2015 | Chen | H01L 27/14614 257/292 |

FOREIGN PATENT DOCUMENTS

| | | |
|---|---|---|
| JP | 2003-526207 A | 9/2003 |
| JP | 2004-228407 | 8/2004 |

(Continued)

*Primary Examiner* — Victor A Mandala
(74) *Attorney, Agent, or Firm* — Lee & Morse, P.C.

(57) ABSTRACT

An image sensor includes a substrate, a shallow trench isolation layer, a first deep trench isolation layer, and a second deep trench isolation layer. The substrate includes a first surface, a second surface opposing the first surface, and a plurality of unit pixel regions. The shallow trench isolation layer is adjacent to the first surface. The first deep trench isolation layer is adjacent to the shallow trench isolation layer and extends toward the second surface in the substrate. The second deep trench isolation layer is adjacent to the second surface and vertically overlaps the first deep trench isolation layer. The first and second deep trench isolation layers isolate the unit pixel regions from each other.

20 Claims, 31 Drawing Sheets

(56) References Cited

FOREIGN PATENT DOCUMENTS

| KR | 2003-0012116 A | 2/2003 |
| KR | 2011-0030670 | 3/2011 |
| KR | 10-2011-0079323 A | 7/2011 |
| KR | 10-2013-0120411 A | 11/2013 |
| KR | 10-2013-0134292 A | 12/2013 |

* cited by examiner

5000

6000

IMAGE SENSOR AND METHOD OF FABRICATING THE SAME

CROSS-REFERENCE TO RELATED APPLICATION

Korean Patent Application No. 10-2014-0076512, filed on Jun. 23, 2014, and entitled, "Image Sensor and Method of Fabricating the Same," is incorporated by reference herein in its entirety.

BACKGROUND

1. Field

One or more embodiments described herein relate to an image sensor and a method of fabricating an image sensor.

2. Description of the Related Art

An image sensor is a semiconductor device that coverts optical images into electrical signals. An image sensor may be categorized as a charge coupled device (CCD)-type or a complementary metal-oxide-semiconductor (CMOS)-type. A CMOS image sensor (CIS) may include pixels arranged in a two-dimensional pattern. Each pixel may include a photodiode that converts incident light into an electrical signal.

Since their inception, the integration of image sensors has been steadily increasing. This increase in integration has resulted in a smaller pixel size, which may adversely affect reliability and performance. For example, the smaller pixel size may allow cross-talk to occur between adjacent pixels.

SUMMARY

In accordance with one embodiment, an image sensor includes a substrate including a first surface, a second surface opposing the first surface, and a plurality of unit pixel regions; a shallow trench isolation layer adjacent to the first surface; a first deep trench isolation layer adjacent to the shallow trench isolation layer and extending toward the second surface in the substrate; and a second deep trench isolation layer adjacent to the second surface and vertically overlapping the first deep trench isolation layer. The first and second deep trench isolation layers may isolate the unit pixel regions from each other.

The first deep trench isolation layer may be in contact with the second deep trench isolation layer. The first deep trench isolation layer may include a filling insulation layer; and a poly-silicon pattern in the filling insulation layer. The poly-silicon pattern may be doped with N-type dopants.

The image sensor may include a dopant injection region in the substrate and along sidewalls of the first and second deep trench isolation layers. The second deep trench isolation layer may include a fixed charge layer; and a filling insulation layer in the fixed charge layer. The second deep trench isolation layer may include an oxygen permeation preventing layer between the fixed charge layer and the filling insulation layer. The fixed charge layer may overlap the second surface.

The second deep trench isolation layer may include a gap-fill supplementary layer between the oxygen permeation preventing layer and the filling insulation layer. A sidewall of the second deep trench isolation layer may be horizontally spaced apart from a sidewall of the first deep trench isolation layer.

The first deep trench isolation layer may be vertically spaced apart from the second deep trench isolation layer. The image sensor further includes a channel stop region between the first deep trench isolation layer and the second deep trench isolation layer. At least one of the first and second deep trench isolation layers may include an air gap region. The image sensor may include a fixed charge layer on the second surface.

The deep trench isolation region may surround each of the unit pixel regions when viewed from a plan view. A width of the first deep trench isolation layer may be different from a width of the second deep trench isolation layer. A vertical length of the first deep trench isolation layer may be different from a vertical length of the second deep trench isolation layer. A vertical length of each of the first and second deep trench isolation layers may be in a range of 2 μm to 5 μm.

At least one of the shallow trench isolation layer, the first deep trench isolation layer, or the second deep trench isolation layer may have an inclined sidewall. A width of the shallow trench isolation layer may progressively increase towards the first surface. A width of the first deep trench isolation layer may progressively increase towards the first surface. A width of the second deep trench isolation layer may progressively increase towards the second surface.

In accordance with another embodiment, an image sensor includes a substrate including a first surface, a second surface opposing the first surface, and a plurality of unit pixel regions; a first deep trench isolation layer adjacent to the first surface and extending toward the second surface in the substrate; and a second deep trench isolation layer adjacent to the second surface. The second deep trench isolation layer overlaps the first deep trench isolation layer when viewed from a plan view. The first and second deep trench isolation layers isolate the unit pixel regions from each other. The first deep trench isolation layer may have substantially a T-shaped cross section.

In accordance with another embodiment, an image sensor includes a first pixel region; a second pixel region; a fixed charge layer over the first and second pixel regions, a first isolation layer between the first and second pixel regions; and a second isolation layer between the first and second pixel regions, wherein the second isolation layer overlaps the first isolation layer and wherein the first and second isolation layers isolate the first pixel region from the second pixel region.

The fixed charge layer may include a material to induce accumulation of holes adjacent a surface of each of the first and second pixel regions. The image sensor may include a poly-silicon pattern in the second isolation layer. The poly-silicon pattern may have a first thermal expansion coefficient, the first and second pixel regions may be in a layer having a second thermal expansion coefficient, and the first thermal expansion coefficient may be substantially equal to the second thermal expansion coefficient.

The second isolation layer may includes at least one of an oxygen permeation preventing layer or a filling insulation layer. The second isolation layer may include a first layer; and a second layer on the first layer, wherein the first layer is closer to the first isolation layer than the second layer, and wherein the second layer is closer to a surface to receive incident light than the first layer. The first layer may include one or more materials, and the second layer may include one or more materials different from the one or more materials of the first layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
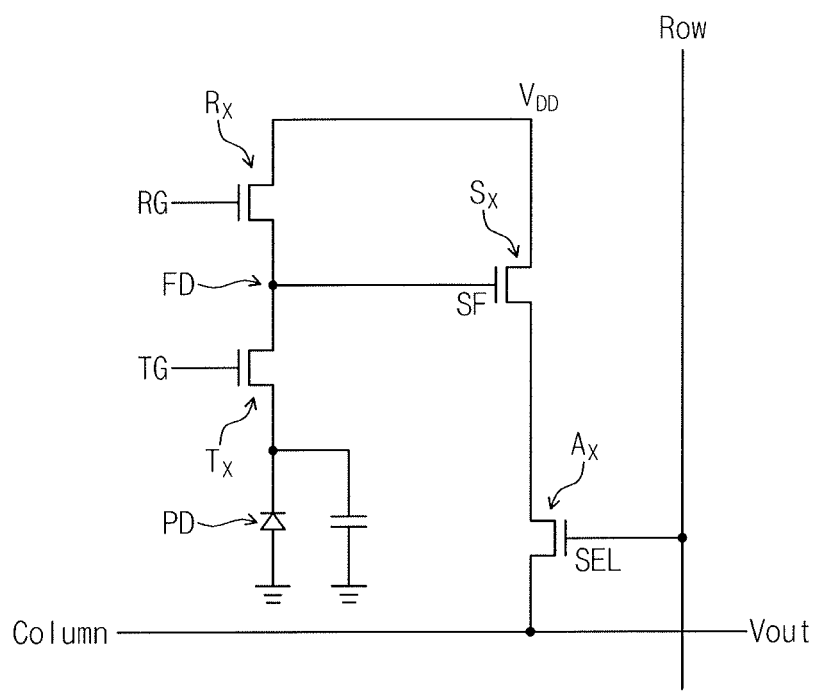
FIG. 1 illustrates an embodiment of an image sensor.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the present embodiments. Accordingly, shapes of the exemplary views may be modified according to manufacturing techniques and/or allowable errors. Therefore, the embodiments of the present embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the present embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 illustrates an embodiment of an image sensor which includes a plurality of pixels. Each pixel includes a photoelectric conversion region PD, a transfer transistor TX, a source follower transistor SX, a reset transistor RX, and a selection transistor AX.

The transfer transistor TX, the source follower transistor SX, the reset transistor RX, and the selection transistor AX may respectively include a transfer gate TG, a source follower gate SF, a reset gate RG, and a selection gate SEL. A photoelectric converter is provided in the photoelectric conversion region PD. The photoelectric converter may be or include a photodiode that includes, for example, an N-type dopant region and a P-type dopant region. A drain of the transfer transistor TX may be a floating diffusion region FD. The floating diffusion region FD may also be a source of the reset transistor RX. The floating diffusion region FD may be electrically connected to the source follower gate SF of the source follower transistor SX. The source follower transistor SX is connected to the selection transistor AX. The reset transistor RX, the source follower transistor SX, and the selection transistor AX may be shared by pixels adjacent to each other, so the integration density of the image sensor may be improved.

Operation of the image sensor will now be described with reference to FIG. 1. First, in a dark state, a power voltage VDD may be applied to a drain of the recess transistor RX and a drain of the source follower transistor SX to discharge charges remaining in the floating diffusion region FD. Thereafter, if the reset transistor RX is turned-off and light is input from the outside into the photoelectric conversion region PD, electron-hole pairs may be generated in the photoelectric conversion region PD. Holes are moved into and accumulated in the P-type dopant region, and electrons are moved into and accumulated in the N-type dopant region.

The transfer transistor TX may be turned-on to transfer the charges into the floating diffusion region FD. The transferred charges may be accumulated in the floating diffusion region FD. A gate bias of the source follower transistor SX may be changed in proportion to the amount of the accumulated charges, to cause variation in the source potential of the source follower transistor SX. At this time, if the selection transistor AX is turned-on, a signal caused by the charges may be sensed through a column line.

Figure 2:
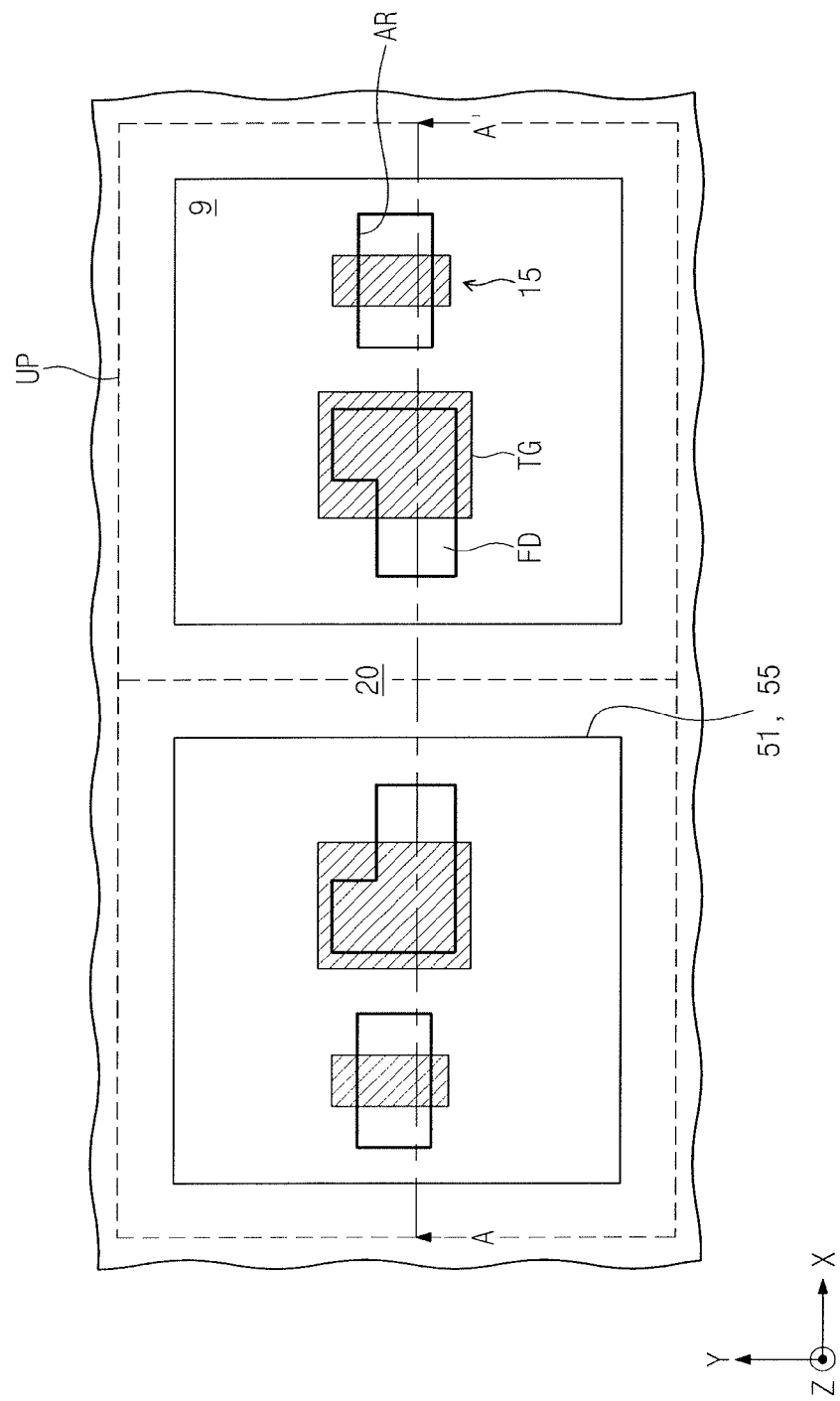
FIG. 2 illustrates a portion of a layout of an image sensor according to one embodiment.
Figure 3:
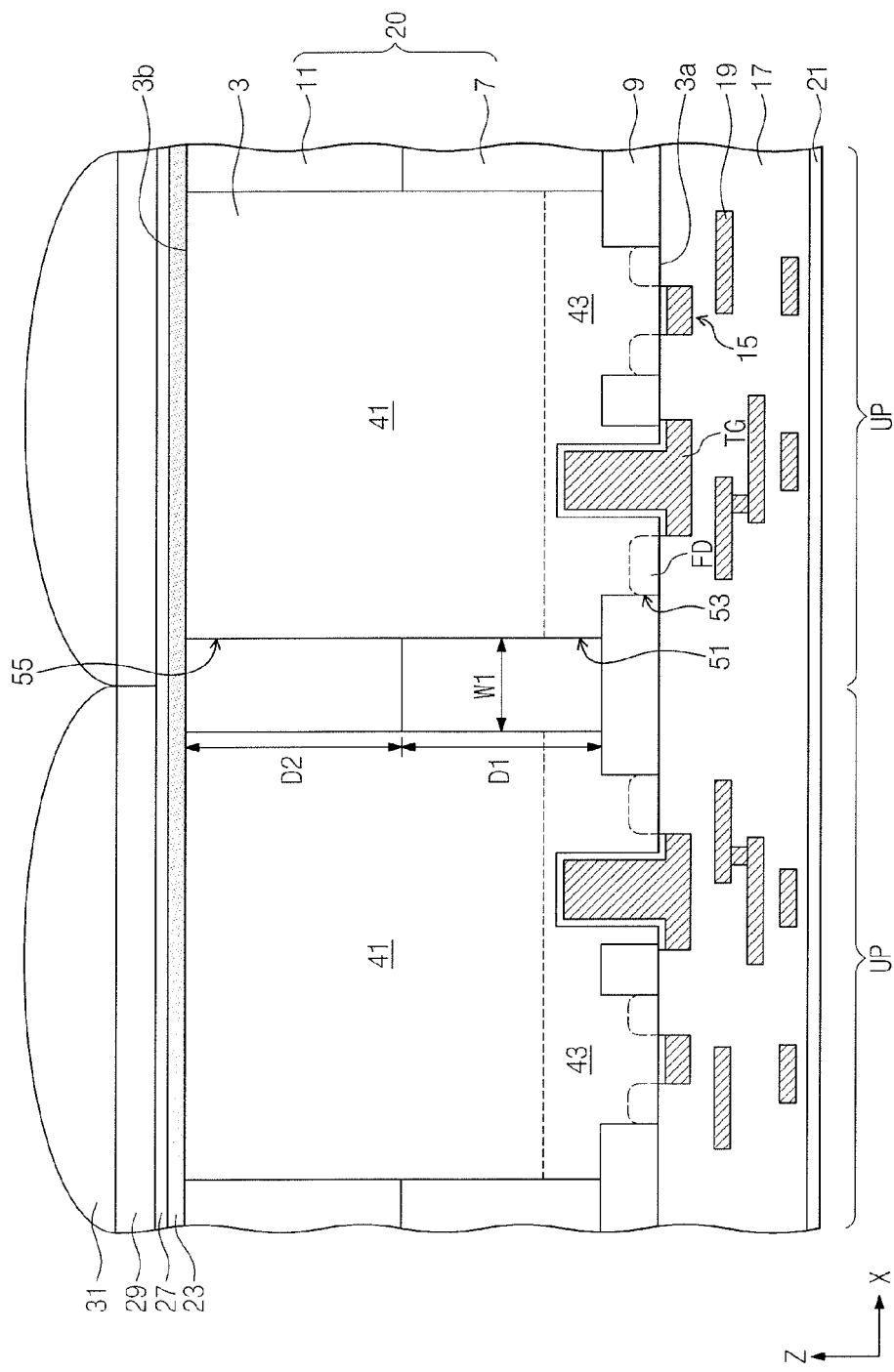
FIG. 3 illustrates a view along section line A-A' in FIG. 2.

FIG. 2 illustrates an example layout of an image sensor, and FIG. 3 is a cross-sectional view taken along line A-A' in FIG. 2. Referring to FIGS. 2 and 3, the example layout includes a substrate 3 having unit pixel regions UP. The substrate 3 may be or include a silicon wafer, a silicon-on-insulator (SOI) substrate, or a semiconductor epitaxial layer. The substrate 3 may include a first surface 3a and a second surface 3b that are opposite to each other. Light may be incident on the second surface 3b, and one or more integrated circuits may be on the first surface 3a.

A shallow trench isolation layer 9 may be on the first surface 3a to define active regions AR. The shallow trench isolation layer 9 may be in a shallow trench 53. The unit pixel regions UP may be isolated from each other by a deep trench isolation region 20. The deep trench isolation region 20 may extend from the shallow trench isolation layer 9 to the second surface 3b in a third direction Z.

The deep trench isolation region 20 may have a mesh shape when viewed from a plan view. For example, the deep trench isolation region 20 may surround each of the unit pixel regions UP. Since the image sensor according to the present embodiment includes the deep trench isolation region 20 separating the unit pixel regions UP from each other, cross-talk between pixels adjacent to each other may be reduced or prevented.

A first dopant injection region 41 may be disposed in the substrate 3 of each of the unit pixel regions UP separated by the deep trench isolation region 20. The first dopant injection region 41 may be adjacent to the second surface 3b. A second dopant injection region 43 may be under the first dopant injection region 41. The second dopant injection region 43 may be adjacent to the first surface 3a. The second dopant injection region 43 may be doped with dopants having a conductivity type opposite to the dopants of the first dopant injection region 41. For example, the first dopant injection region 41 may be doped with N-type dopants, and the second dopant injection region 43 may be doped with P-type dopants. The first dopant injection region 41 and the second dopant injection region 43 may constitute the photoelectric conversion region PD of FIG. 1.

The shallow trench isolation layer 9 may be on the first surface 3a to define the active region AR in the unit pixel region UP. A floating diffusion region FD may be in the active region AR and may be adjacent to the first surface 3a. A transfer gate TG may be disposed on the first surface 3a to cross the active region AR, e.g., to partially overlap the floating diffusion region. As illustrated in FIG. 3, the transfer gate TG may be a vertical-type transfer gate shape that includes a portion extending in the third direction Z into the substrate 3. Alternatively, the transfer gate TG may be a flat-type transfer gate that is on only the first surface 3a of the substrate 3.

A transistor 15 may be at a position spaced apart from the transfer gate TG. The transistor 15 may correspond to at least one of the source follower transistor SX, the reset transistor RX, or the selection transistor AX. A multi-layered interlayer insulating layer 17 and interconnections 19 may be on the first surface 3a. The interlayer insulating layer 17 may be covered with a first passivation layer 21.

The deep trench isolation region 20 may include a first deep trench isolation layer 7 adjacent to the shallow trench isolation layer 9 and a second deep trench isolation layer 11 adjacent to the second surface 3b. The first deep trench isolation layer 7 is disposed in a first deep trench 51, and the second deep trench isolation layer 11 is disposed in a second deep trench 55. In the present embodiment, the first and second deep trench isolation layers 7 and 11 may include, for example, silicon oxide. A top surface of the second deep trench isolation layer 11 may be coplanar with the second surface 3b.

In the present embodiment, the first deep trench isolation layer 7 may have a first vertical length or thickness D1 (e.g., in the third direction Z) and the second deep trench isolation layer 11 may have a second vertical length or thickness D2 (e.g., in the third direction Z). The first vertical length D1 may be equal to or different from the second vertical length D2. In some embodiments, the first deep trench isolation layer 7 and the second deep trench isolation layer 11 may have the same width W1, as illustrated in FIG. 3. In addition, a sidewall of the first deep trench isolation layer 7 may be aligned a sidewall of the second deep trench isolation layer 11, as illustrated in FIG. 3. Each of the first and second vertical lengths D1 and D2 of the first and second deep trench isolation layers 7 and 11 may be in a predetermined range. An example of the predetermined range is 2 μm to 5 μm. The predetermined range may be different in another embodiment.

A fixed charge layer 23 is on the second surface 3b. The fixed charge layer 23 may include, for example, a metal oxide layer including oxygen having a content ratio lower than its stoichiometric ratio, or a metal fluoride layer including fluorine having a content ratio lower than its stoichiometric ratio. Thus, in one embodiment, the fixed charge layer 23 may have negative fixed charges. The fixed charge layer 23 may include a metal oxide or metal fluoride that includes at least one of hafnium (Hf), zirconium (Zr), aluminum (Al), tantalum (Ta), titanium (Ti), yttrium (Y), tungsten (W), or lanthanoid. In one example embodiment, the fixed charge layer 23 may include a hafnium oxide layer or an aluminum fluoride layer. Holes may be accumulated in the neighborhood of the second surface 3b by the fixed charge layer 23. Thus, it is possible to effectively reduce occurrence of a dark current and/or white spots.

The fixed charge layer 23 may be covered with a second passivation layer 27. Each of the first and second passivation layers 21 and 27 may include at least one of a silicon nitride layer or a polyimide layer. A color filter 29 and a micro-lens 31 may be sequentially stacked on the second passivation layer 27 in each of the unit pixel regions UP. The color filters 29 may be arranged in a matrix, or other predetermined pattern, form to form a color filter array. The color filter array may have, for example, a Bayer pattern including a red filter, a green filter, and a blue filter. In other embodiments, the color filter array may include a different combination of color filters, e.g., a yellow filter, a magenta filter, and a cyan filter. In addition, the color filter array may include a white filter.

Figure 4:
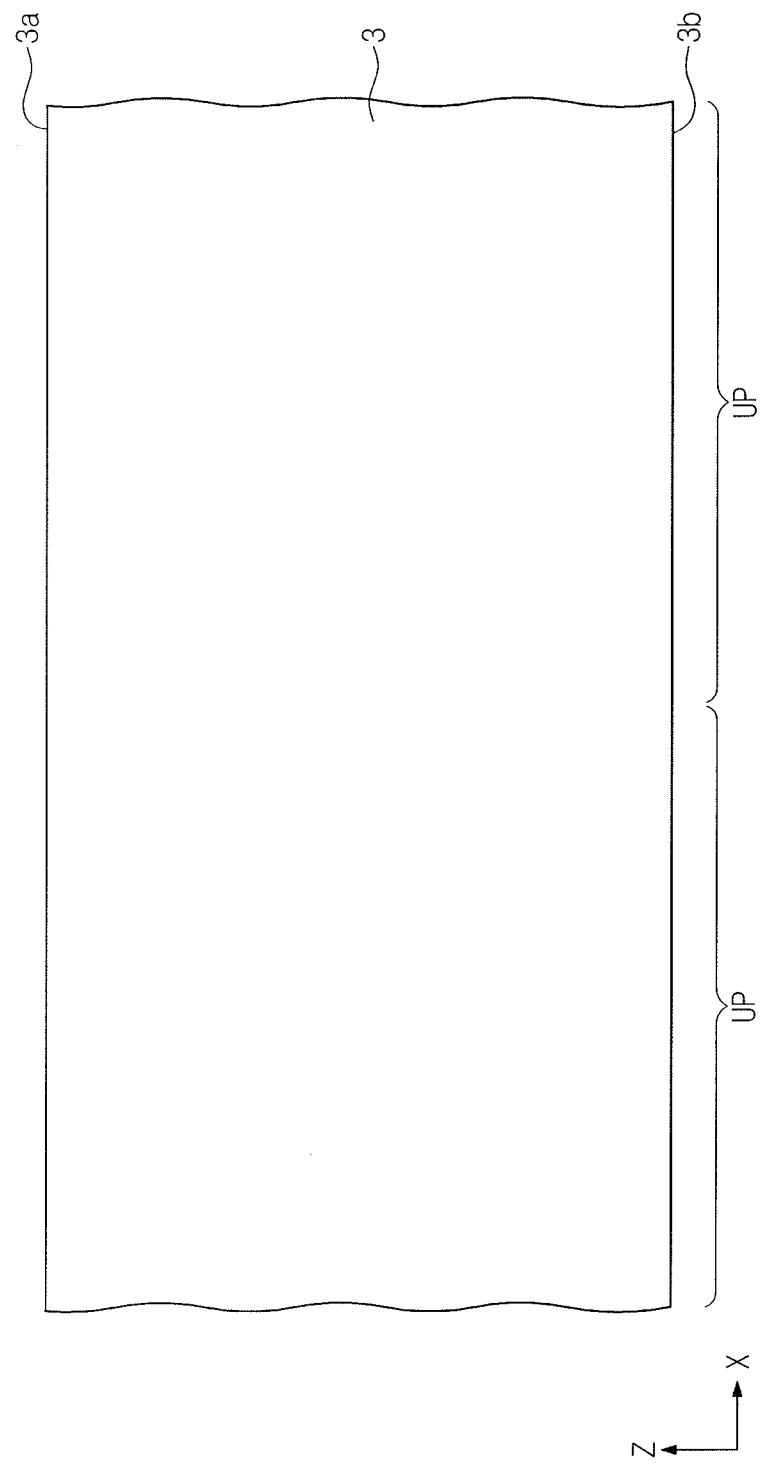
FIGS. 4 to 11 illustrate stages in an embodiment of a method for fabricating an image sensor in FIG. 3.

FIGS. 4 to 11 are cross-sectional views illustrating stages in one embodiment of a method for fabricating the image sensor in FIG. 3. Referring to FIG. 4, the substrate 3 including the plurality of unit pixel regions UP is prepared.

The substrate 3 includes the first surface 3a and the second surface 3b opposite to each other. The substrate 3 may be or include, for example, a semiconductor wafer (e.g., a silicon wafer or a silicon-on-insulator (SOI) substrate) or a semiconductor epitaxial layer.

Figure 5:
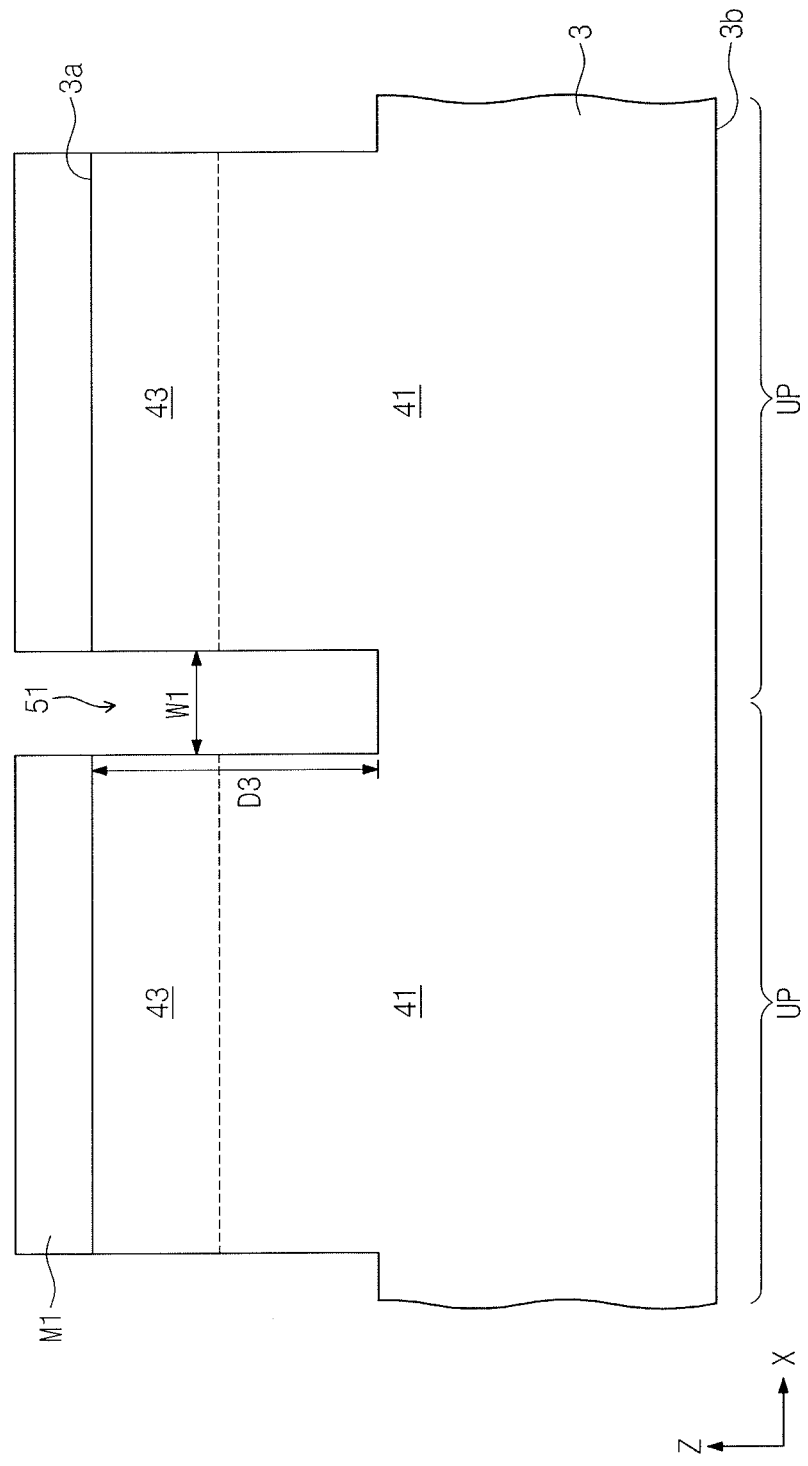

Referring to FIG. 5, a plurality of ion implantation processes may be performed to form a first dopant injection region 41 and a second dopant injection region 43 in the substrate 3 of each of the unit pixel regions UP. For example, the first dopant injection region 41 may be doped with N-type dopants, and the second dopant injection region 43 may be doped with P-type dopants. A first mask pattern M1 that defines a first deep trench 51 may be formed on the substrate 3. The substrate 3 may be patterned using the first mask pattern M1 as an etch mask to form the first deep trench 51 in the substrate 3. The first deep trench 51 is formed at a boundary between the unit pixel regions UP. A bottom surface of the first deep trench 51 is spaced apart from the second surface 3b of the substrate 3. The first deep trench 51 may be formed to have a first depth D3 and a first width W1, e.g., a thickness in the first direction X.

Figure 6:
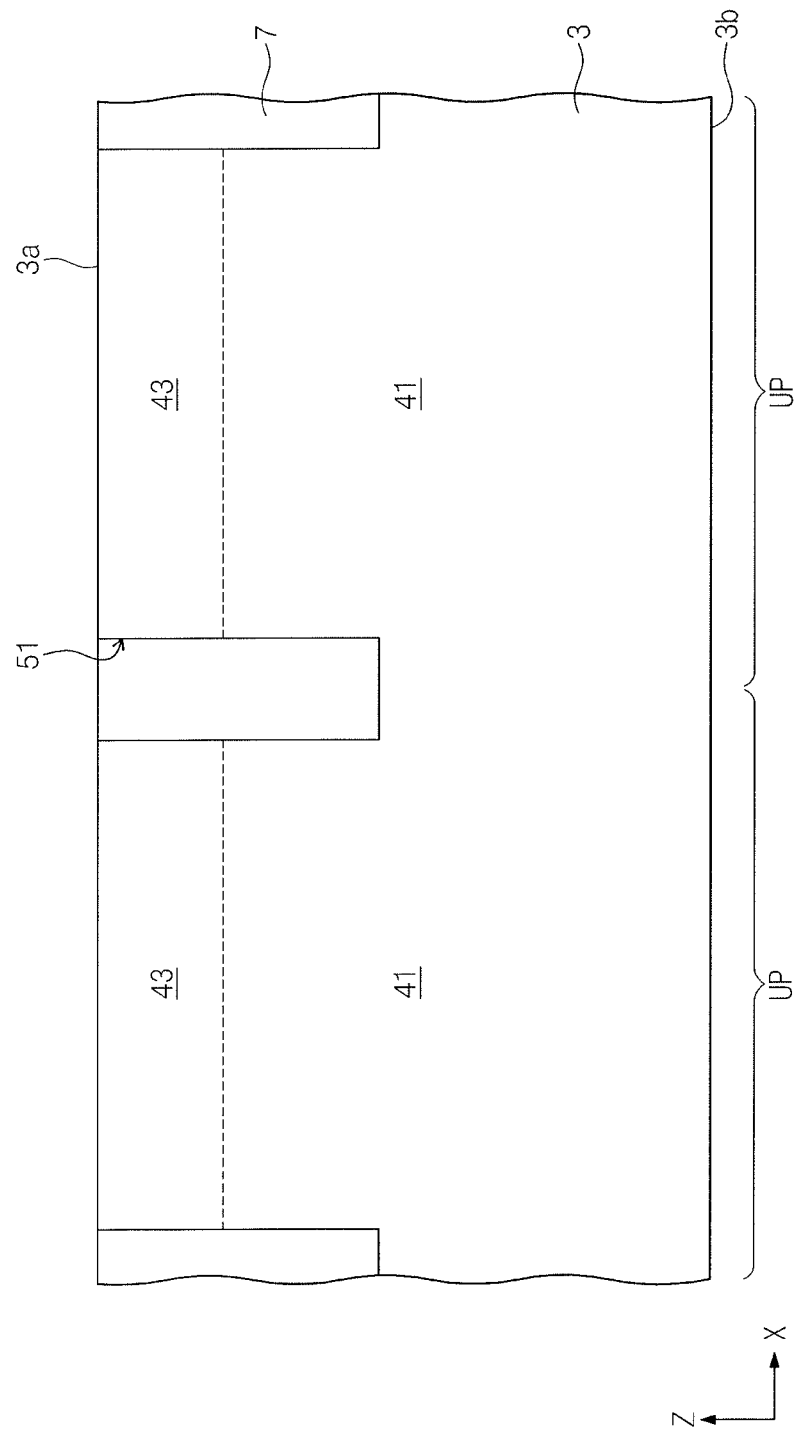

Referring to FIG. 6, the first mask pattern M1 is removed. An insulating layer such as a silicon oxide layer may be formed on the first surface 3a. A planarization etching process may be performed on the insulating layer to form the first deep trench isolation layer 7 in the first deep trench 51.

Figure 7:
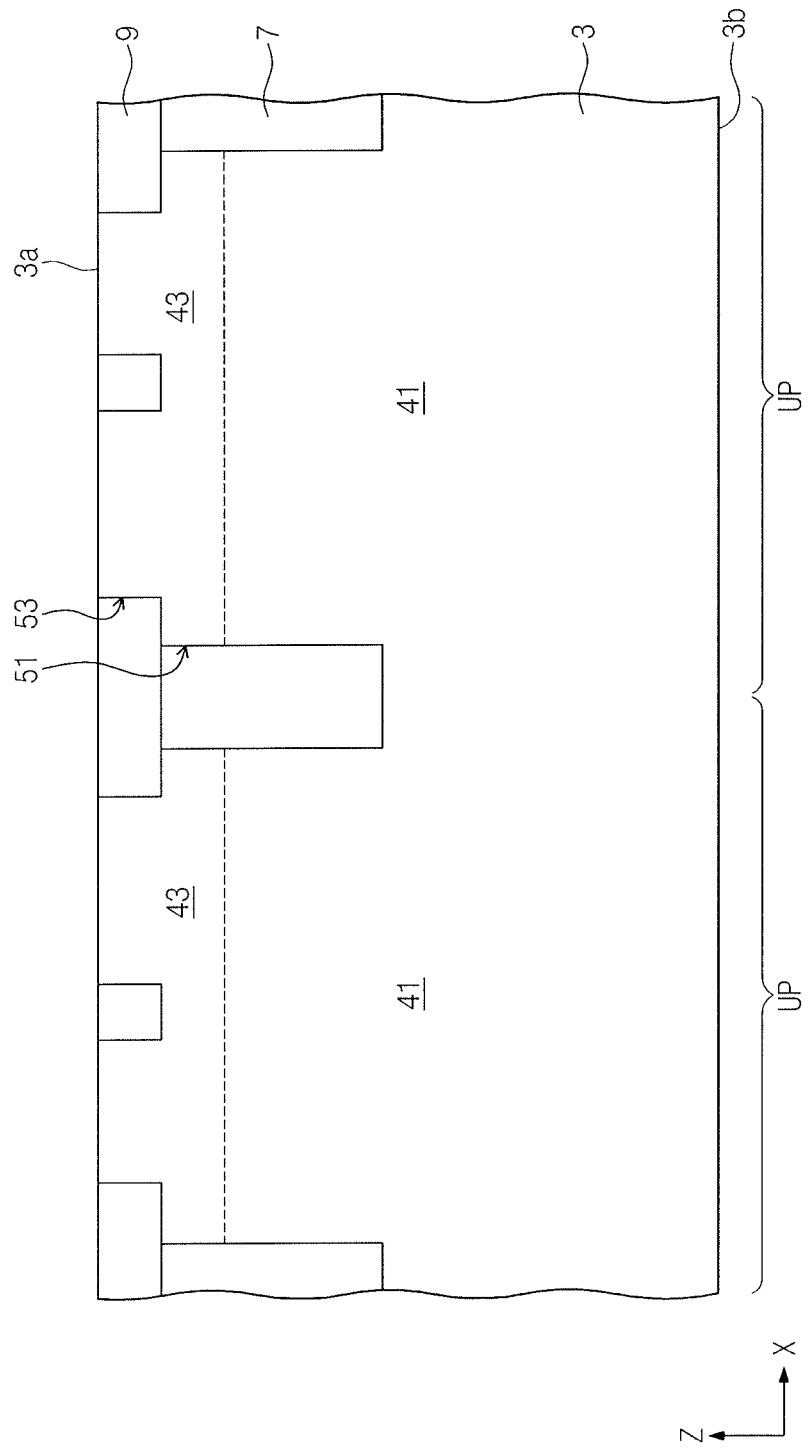

Referring to FIG. 7, a portion of the substrate 3 and a portion of the first deep trench isolation layer 7 that are adjacent to the first surface 3a may be removed to form a shallow trench 53. An insulating layer such as a silicon oxide layer may be formed on the first surface 3a, and a planarization etching process may be performed on the insulating layer to form a shallow trench isolation layer 9 in the shallow trench 53. Thus, the first deep trench isolation layer 7 may have the first vertical length D1.

Figure 8:
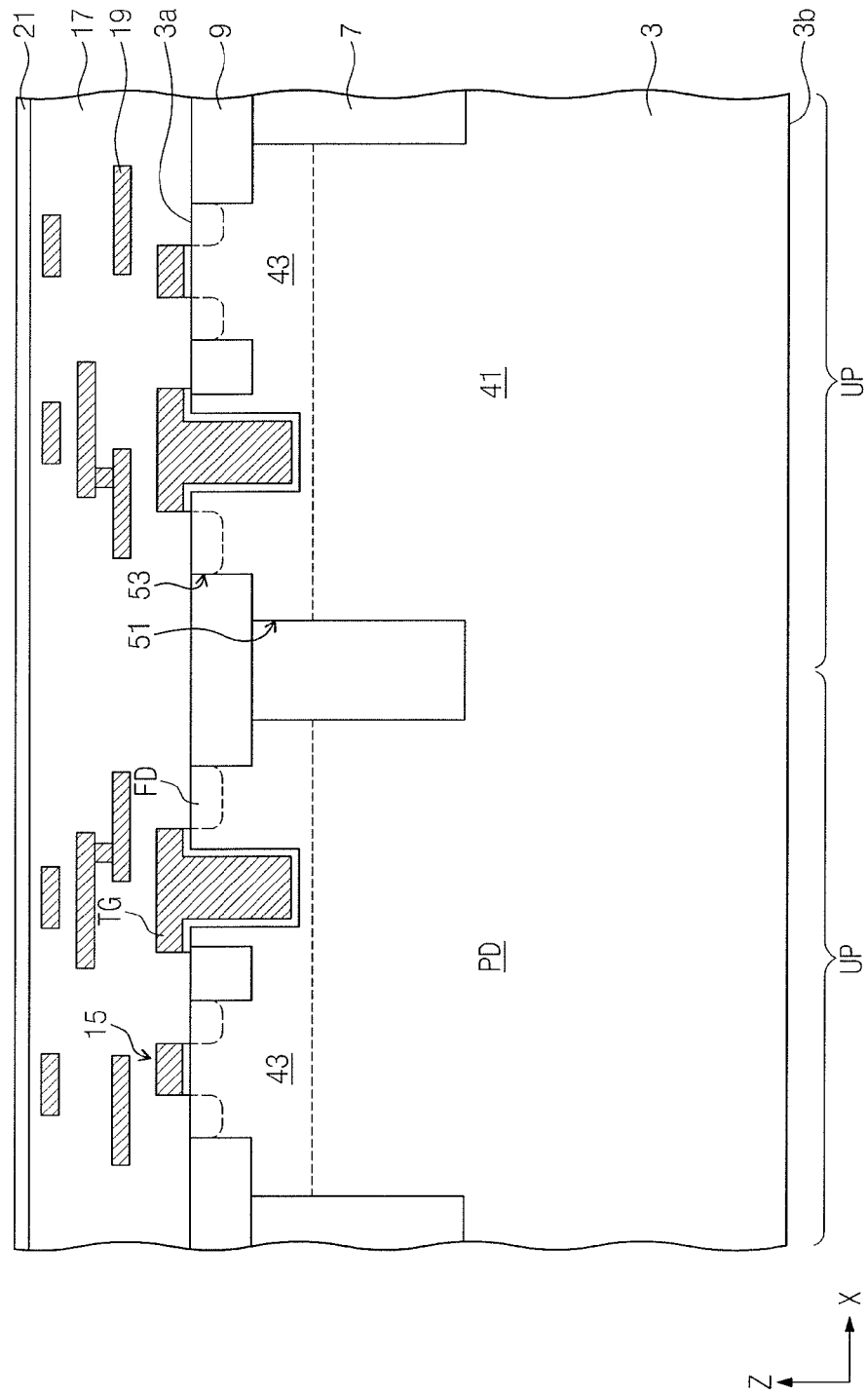

Referring to FIG. 8, a transfer gate TG, a floating diffusion region FD, and a transistor 15 may be formed to be adjacent to the first surface 3a. Thereafter, the interconnections 19, the interlayer insulating layer 17, and the first passivation layer 21 may be formed.

Figure 9:
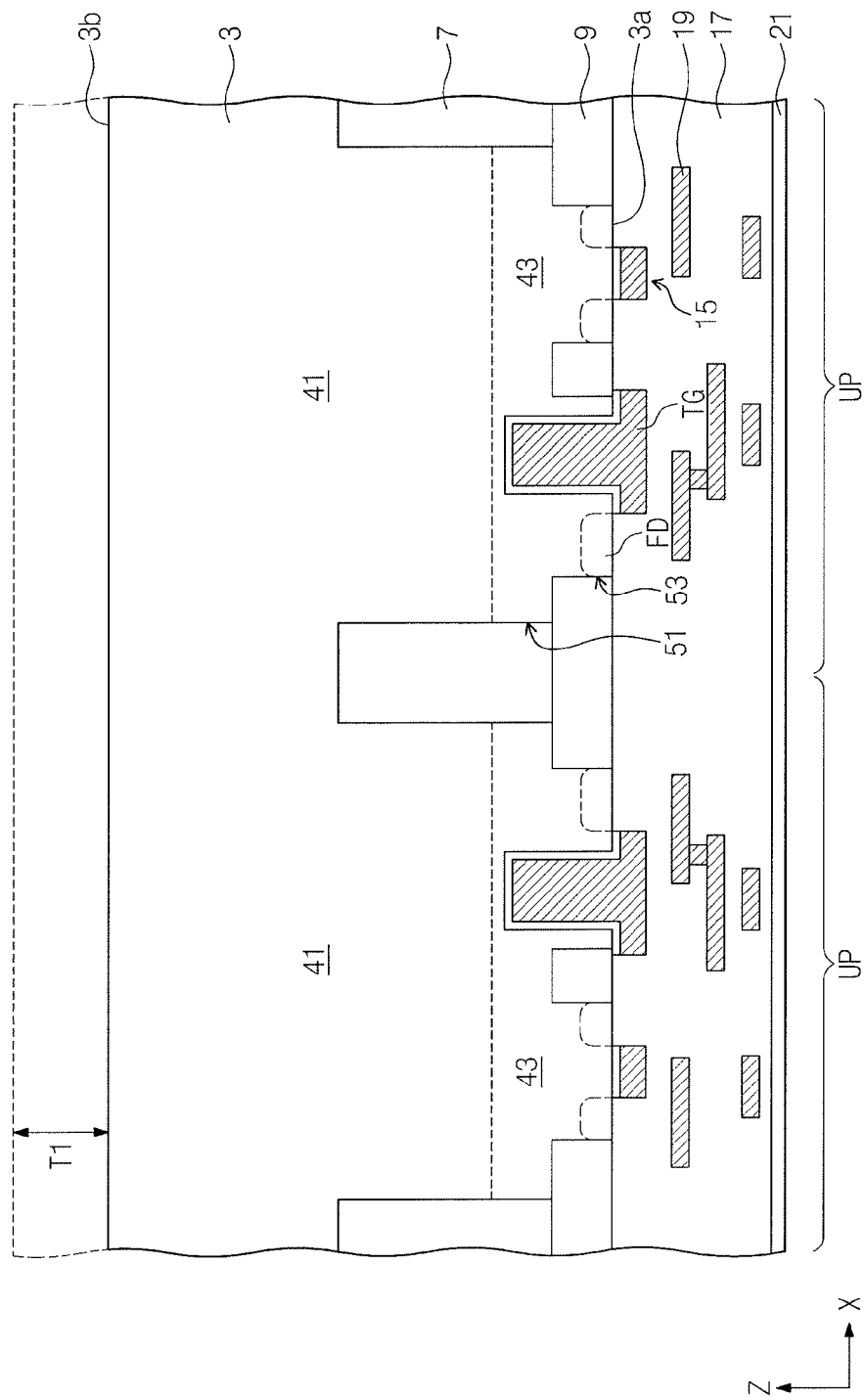

Referring to FIG. 9, the substrate 3 may be overturned (e.g., rotated 180°) so the second surface 3b faces upward. A planarization etching process may be performed to remove a portion of the substrate 3 by a first thickness Ti. At this time, the first deep trench isolation layer 7 may not be exposed.

Figure 10:
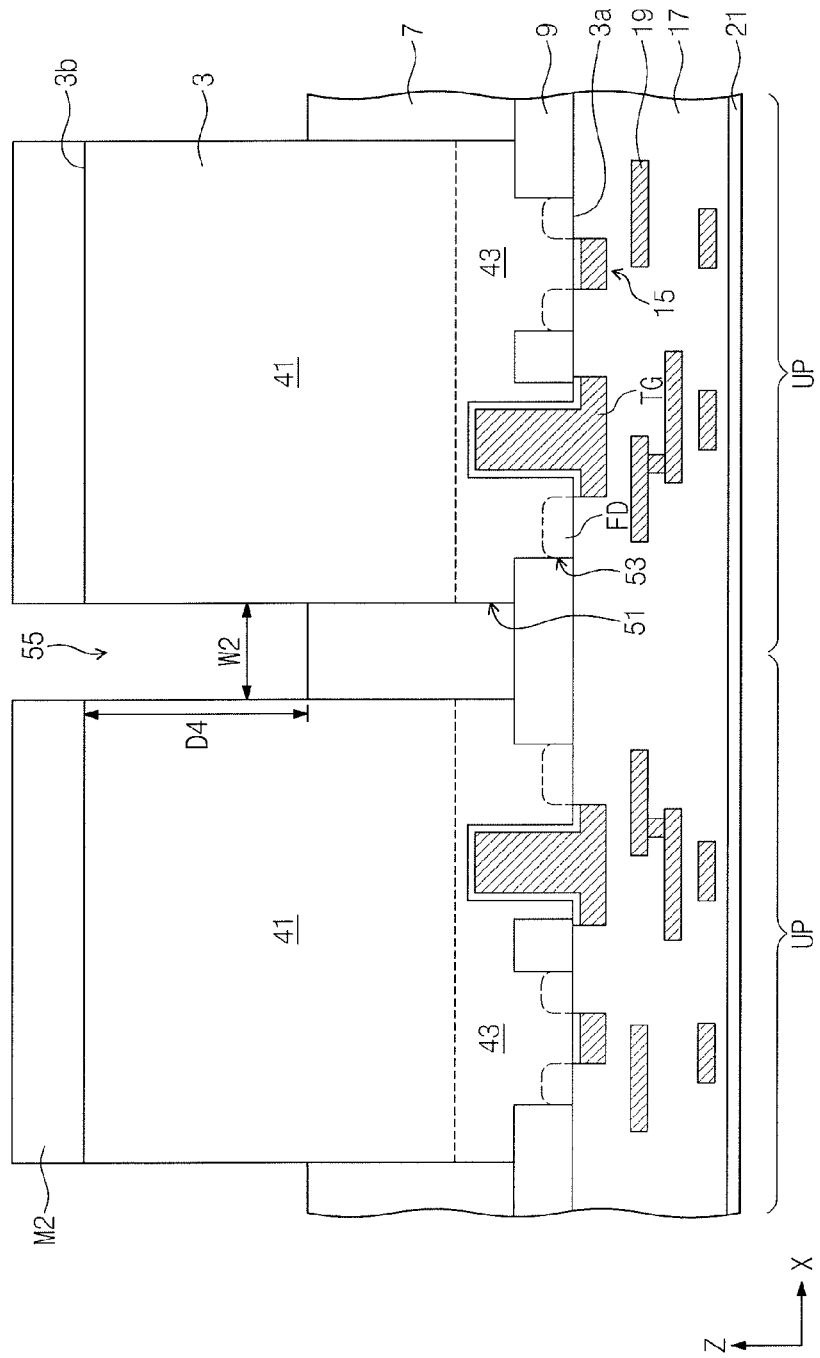

Referring to FIG. 10, a second mask pattern M2 may be formed on the second surface 3b of the substrate 3. The second mask pattern M2 may have an opening that overlaps with the first deep trench isolation layer 7 when viewed from a plan view. The substrate 3 may be etched using the second mask pattern M2 as an etch mask to form the second deep trench 55 exposing the first deep trench isolation layer 7. At this time, the second deep trench 55 may have a second depth D4 and a second width W2. The second depth D4 may be equal to or different from the first depth D3. In the embodiment of FIG. 10, the second width W2 is substantially equal to the first width W1.

Figure 11:
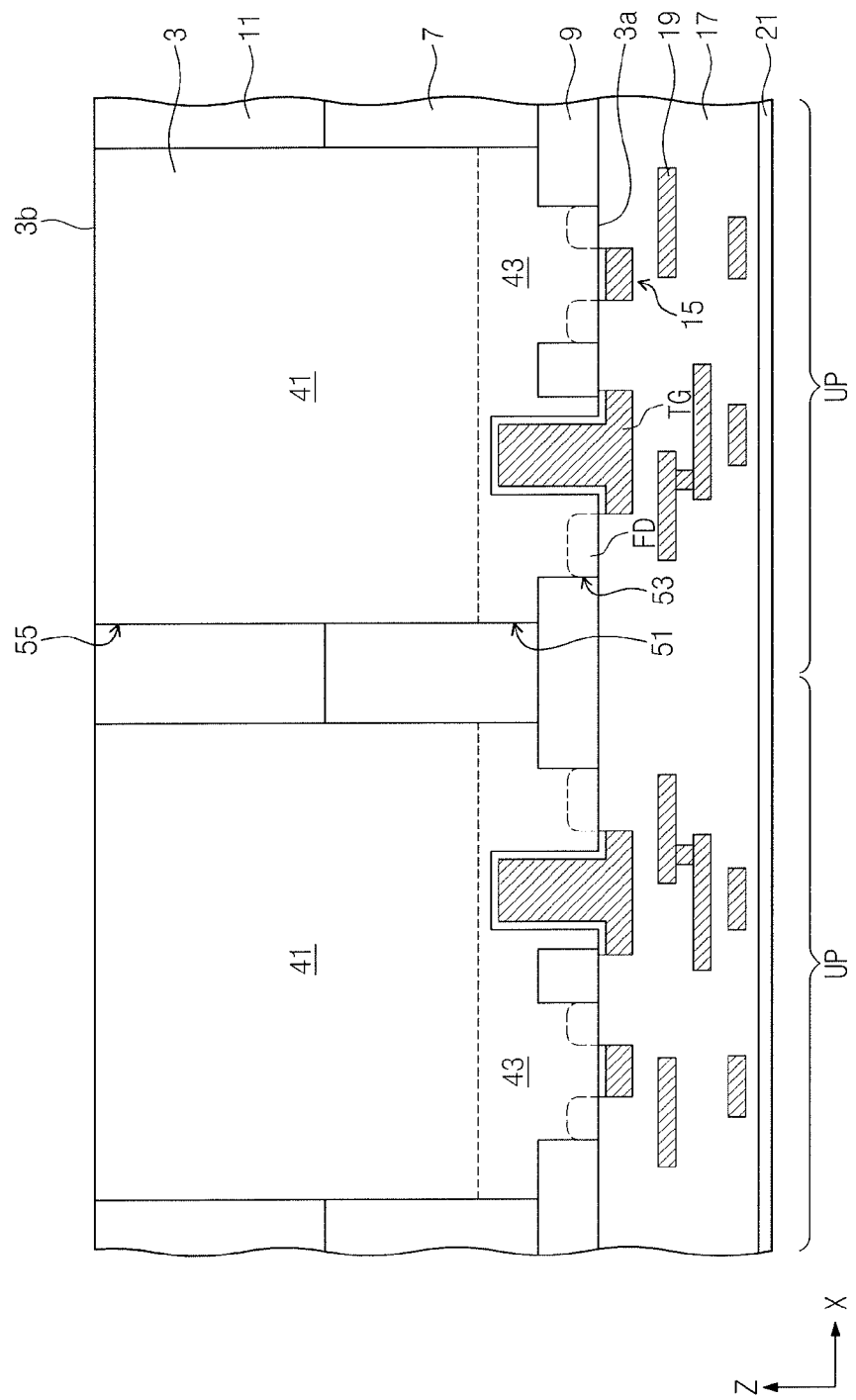

Referring to FIG. 11, the second mask pattern M2 is removed. An insulating layer such as a silicon oxide layer may be formed on the second surface 3b. A planarization etching process may be performed on the insulating layer to form a second deep trench isolation layer 11 in the second deep trench 55.

Referring again to FIG. 3, subsequently, a fixed charge layer 23 is deposited on the second surface 3b of the substrate 3. The fixed charge layer 23 may be formed, for example, by a chemical vapor deposition (CVD) method or an atomic layer deposition (ALD) method. The fixed charge layer 23 may include, for example, a metal oxide layer including oxygen having a content ratio lower than its stoichiometric ratio, or a metal fluoride layer including fluorine having a content ratio lower than its stoichiometric ratio. The fixed charge layer 23 may include a metal oxide or metal fluoride including at least one selected from a group consisting of hafnium (Hf), zirconium (Zr), aluminum (Al), tantalum (Ta), titanium (Ti), yttrium (Y), tungsten (W), or lanthanoid.

In some embodiments, process temperatures of subsequent processes, to be performed after the formation of the fixed charge layer 23, may be equal to or lower than that of the process of forming the fixed charge layer 23. Thus, the content ratio of the oxygen, which is lower than its stoichiometric ratio, may be maintained in the fixed charge layer 23. As a result, in one embodiment, the fixed charge layer 23 may have negative fixed charges. A second passivation layer 27 may be formed on the second surface 3b of the substrate. Thereafter, the color filter 29 and the micro-lens 31 may be sequentially formed on each of the unit pixel regions UP.

In the present embodiment, a plurality of deep trenches may be formed for the formation of the deep trench isolation region 20. For example, to form the deep trench isolation region 20, the first surface 3a of the substrate 3 may be etched to form the first deep trenches 51 of the first depth D3, and the second surface 3b of the substrate 3 may be etched to form the second deep trenches 55 of the second depth D4. Thus, an etched depth during one etching process may be reduced to improve a margin of the etching process.

In addition, the depths, which are to be filled with insulating layers, of the first and second deep trenches 51 and 55 may be reduced to improve gap-fill characteristics of the first and second deep trench isolation layers 7 and 11. Thus, reproducibility of reliable image sensors may increase.

Moreover, if a trench is formed by one etching process for the formation of the deep trench isolation portion, the trench may be very deep. Thus, the width of an upper portion of the trench may be sufficiently large to prevent a not-open phenomenon of the trench. As a result, it may be difficult to reduce the size of the deep trench isolation portion. For example, it may be difficult to realize a highly integrated image sensor under some circumstances. However, since the deep trench isolation region 20 is formed using two etching processes in the present embodiment, the width of the deep trench isolation region 20 may be relatively reduced. As a result, a highly integrated image sensor may be easily realized.

Figure 12A:
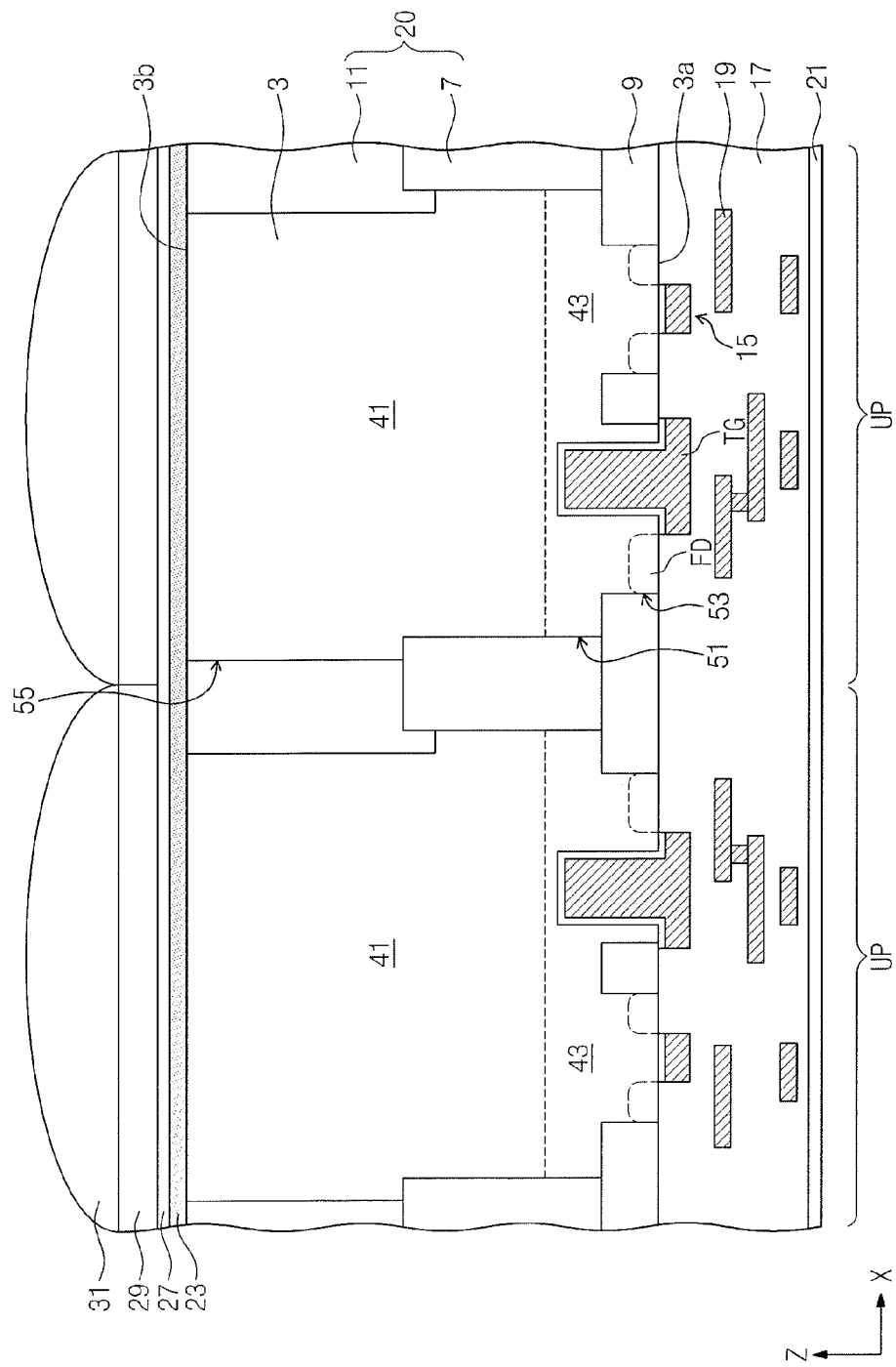
FIGS. 12A to 12E illustrate modified embodiments of the image sensor in FIG. 3.

FIGS. 12A to 12E are cross-sectional views illustrating various modified embodiments of the image sensor of FIG. 3. Referring to FIG. 12A, a sidewall of the first deep trench isolation layer 7 may be spaced apart from a sidewall of the second deep trench isolation layer 11 in an image sensor according to this modified embodiment. Misalignment of the second mask pattern M2 may occur when the second deep trench 55 is formed as described with reference to FIG. 10, so the image sensor according to this modified embodiment may be fabricated.

The second deep trench 55 may partially expose the top surface of the first deep trench isolation layer 7 by the misalignment of the second mask pattern M2. The second deep trench isolation layer 11 filling the second deep trench 55 may cover a portion of the top surface and a portion of the sidewall of the first deep trench isolation layer 7. Other elements and/or other fabricating processes of the image sensor according to this modified embodiment may be the same as or similar to corresponding elements and corresponding fabricating processes of the image sensor described with reference to FIGS. 3 to 11.

Figure 12B:
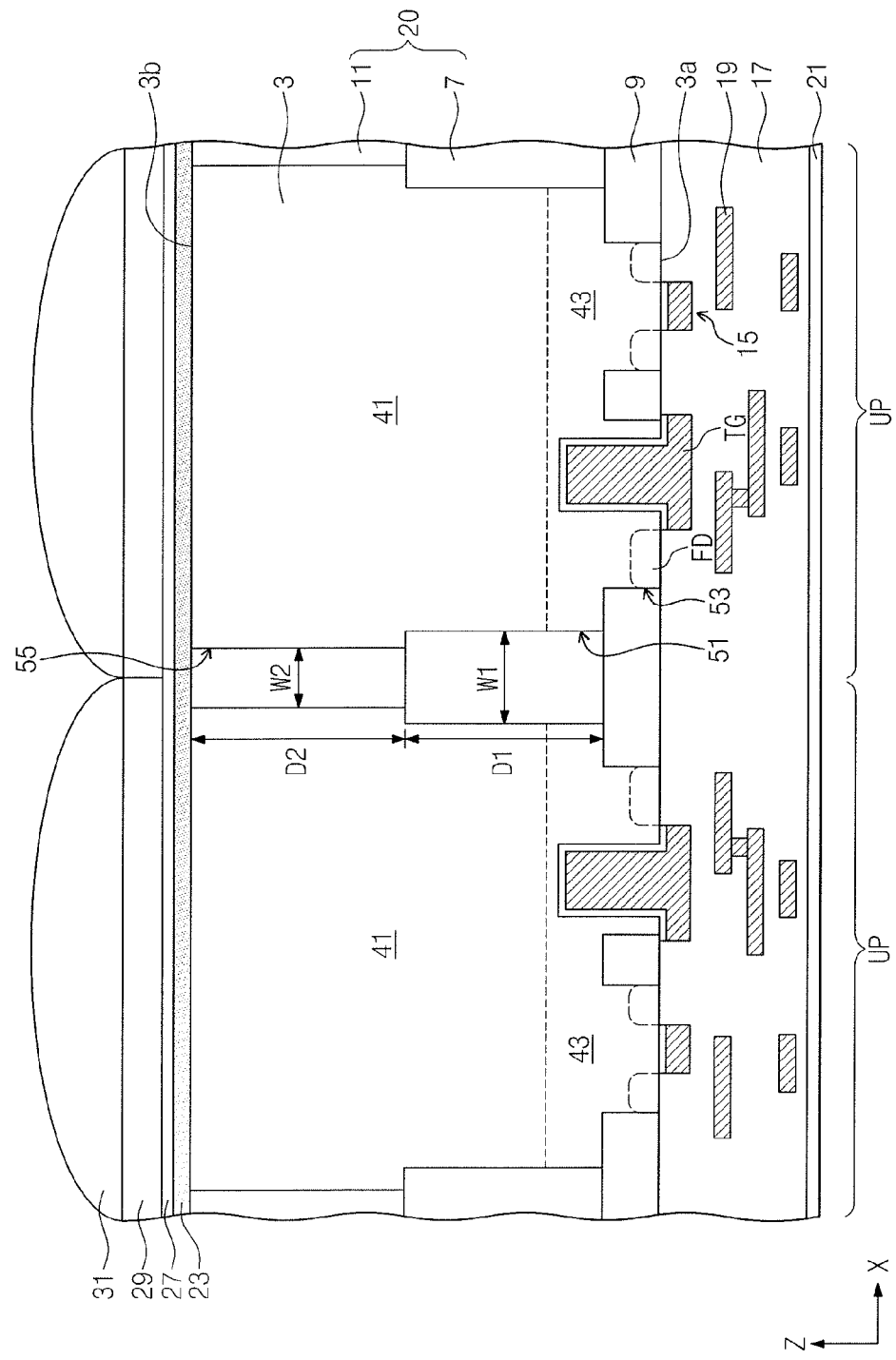

Referring to FIG. 12B, the width W1 of the first deep trench isolation layer 7 may be different from the width W2 of the second deep trench isolation layer 11. In this modified embodiment, the width W1 of the first deep trench isolation layer 7 may be greater than the width W2 of the second deep trench isolation layer 11. Also, the vertical length D1 of the first deep trench isolation layer 7 may be different from the vertical length D2 of the second deep trench isolation layer 11. Other elements and/or other fabricating processes of the image sensor according to this modified embodiment may be the same as or similar to corresponding elements and corresponding fabricating processes of the image sensor described with reference to FIGS. 3 to 11.

Figure 12C:
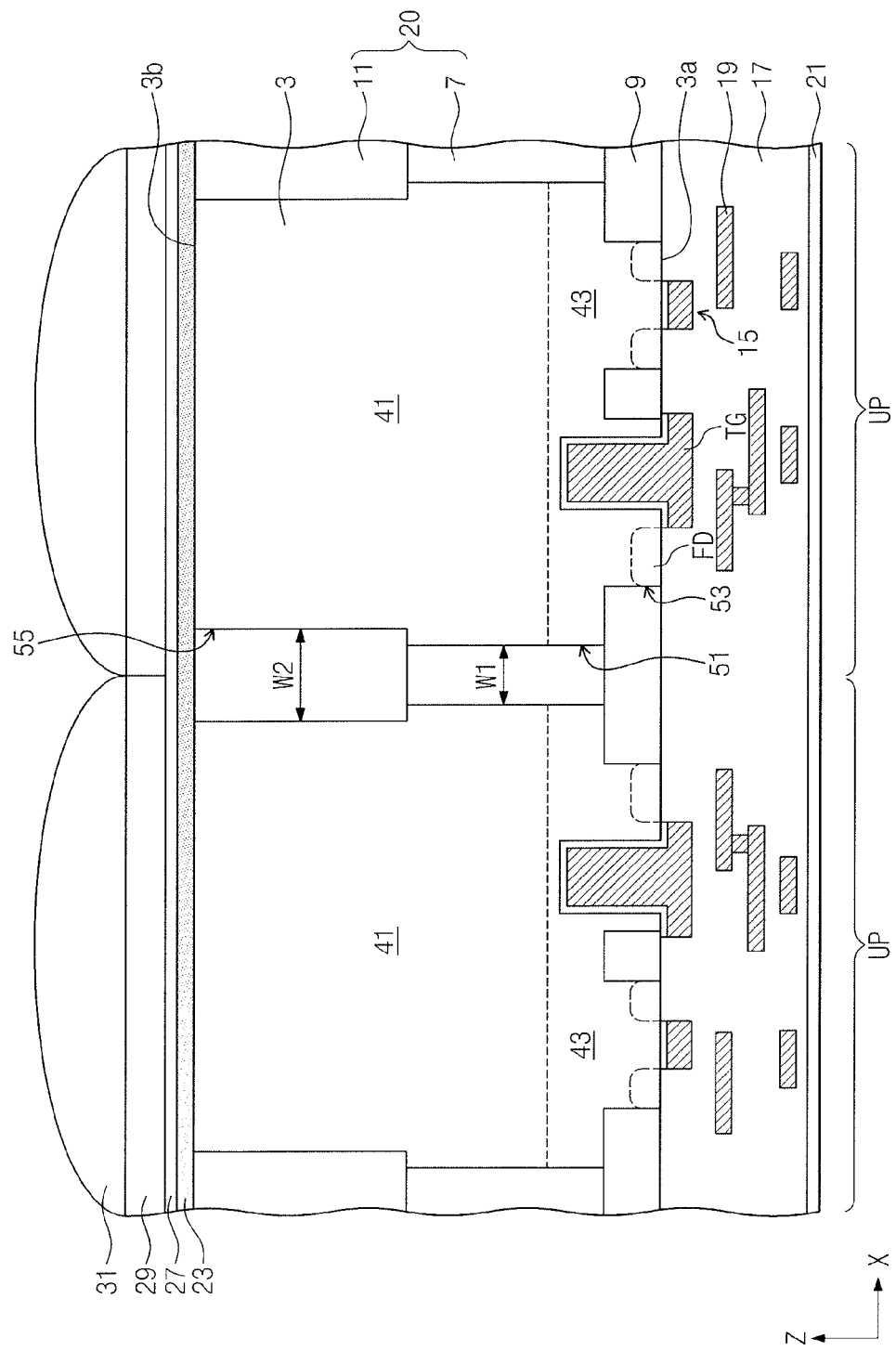

Referring to FIG. 12C, the width W1 of the first deep trench isolation layer 7 may be different from a width W2 of the second deep trench isolation layer 11. In this modified embodiment, the width W1 of the first deep trench isolation layer 7 may be less than the width W2 of the second deep trench isolation layer 11. Other elements and/or other fabricating processes of the image sensor according to the present modified embodiment may be the same as or similar to corresponding elements and corresponding fabricating processes of the image sensor described with reference to FIG. 12B.

Figure 12D:
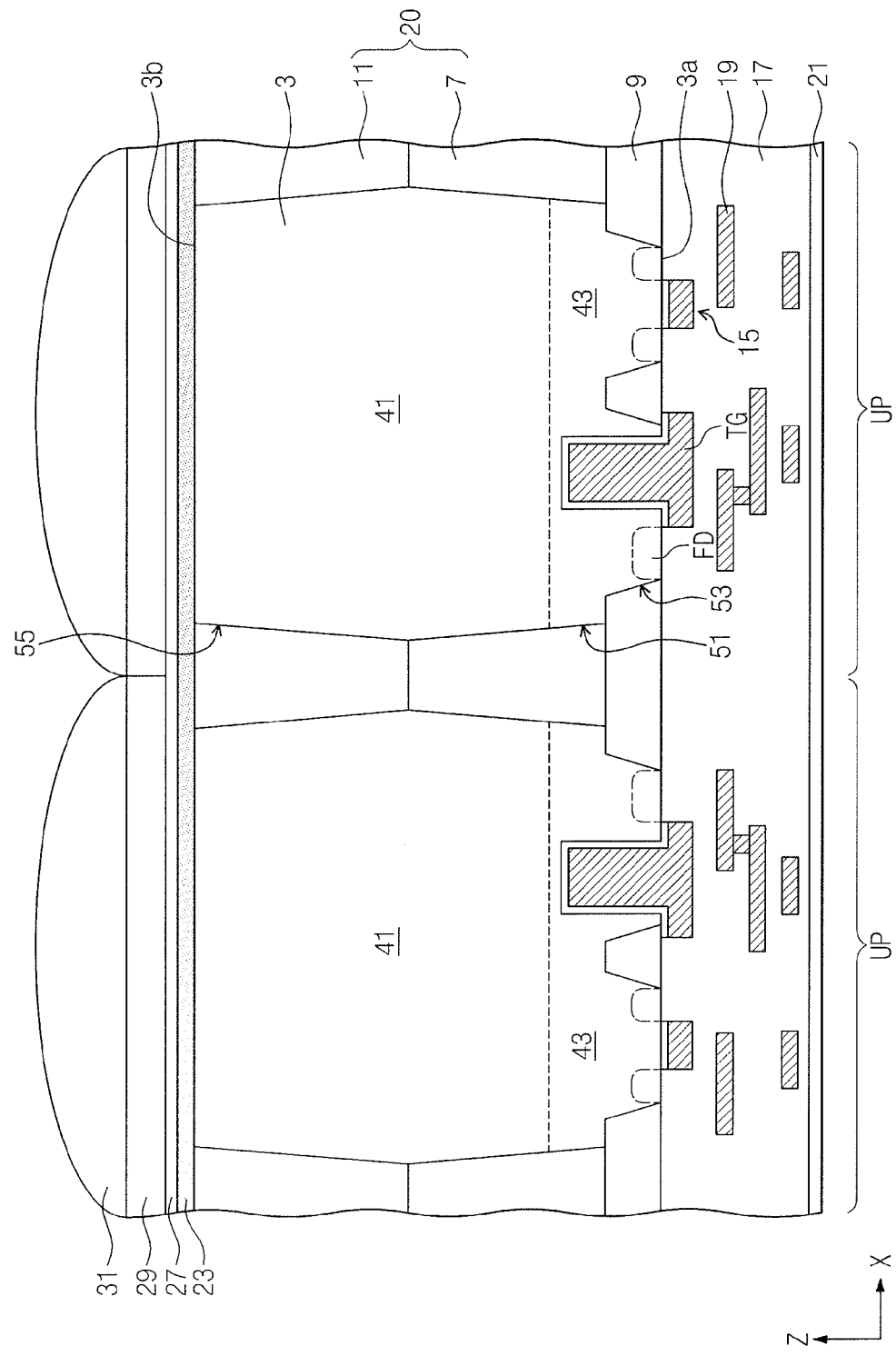

Referring to FIG. 12D, a sidewall of the shallow trench isolation layer 9 may be inclined in an image sensor according to this modified embodiment. The width of the shallow trench isolation layer 9 may become progressively greater toward the first surface 3a, or may become progressively less toward the second surface 3b. A sidewall of the first deep trench isolation layer 7 may also be inclined. The width of the first deep trench isolation layer 7 may become progressively greater toward the first surface 3a, or may become progressively less toward the second surface 3b. A sidewall of the second deep trench isolation layer 11 may also be inclined. A width of the second deep trench isolation layer 11 may become progressively less toward the first surface 3a, or may become progressively greater toward the second surface 3b. Thus, a central portion of the deep trench isolation region 20 may be relatively narrow, and the deep trench isolation region 20 may become progressively wider toward its bottom and top ends.

In this modified embodiment, one surface of the shallow trench isolation layer 9, which is disposed between the sidewall of the shallow trench isolation layer 9 and the sidewall of the first deep trench isolation layer 7 adjacent thereto, may be flat and in contact with the substrate 3. For example, a lower corner of the first deep trench isolation layer 7 may contact the one surface of the shallow trench isolation layer 9 and may be spaced apart from an upper corner of the shallow trench isolation layer 9.

A sidewall of the shallow trench 53 may be inclined, so the shallow trench isolation layer 9 may be formed to have an inclined sidewall. Likewise, a sidewall of the first deep trench 51 may be inclined, so the first deep trench isolation layer 7 may be formed to have an inclined sidewall. A sidewall of the second deep trench 55 may be inclined, so the second deep trench isolation layer 11 may have an inclined sidewall.

Also, a gradient of the sidewall of the shallow trench isolation layer 9, a gradient of the sidewall of the first deep trench isolation layer 7, and a gradient of the sidewall of the second trench isolation layer 11 may be equal to or different from each other. Other elements and/or other fabricating processes of the image sensor according to the present modified embodiment may be the same as or similar to corresponding elements and corresponding fabricating processes of the image sensor described with reference to FIGS. 3 to 11.

Figure 12E:
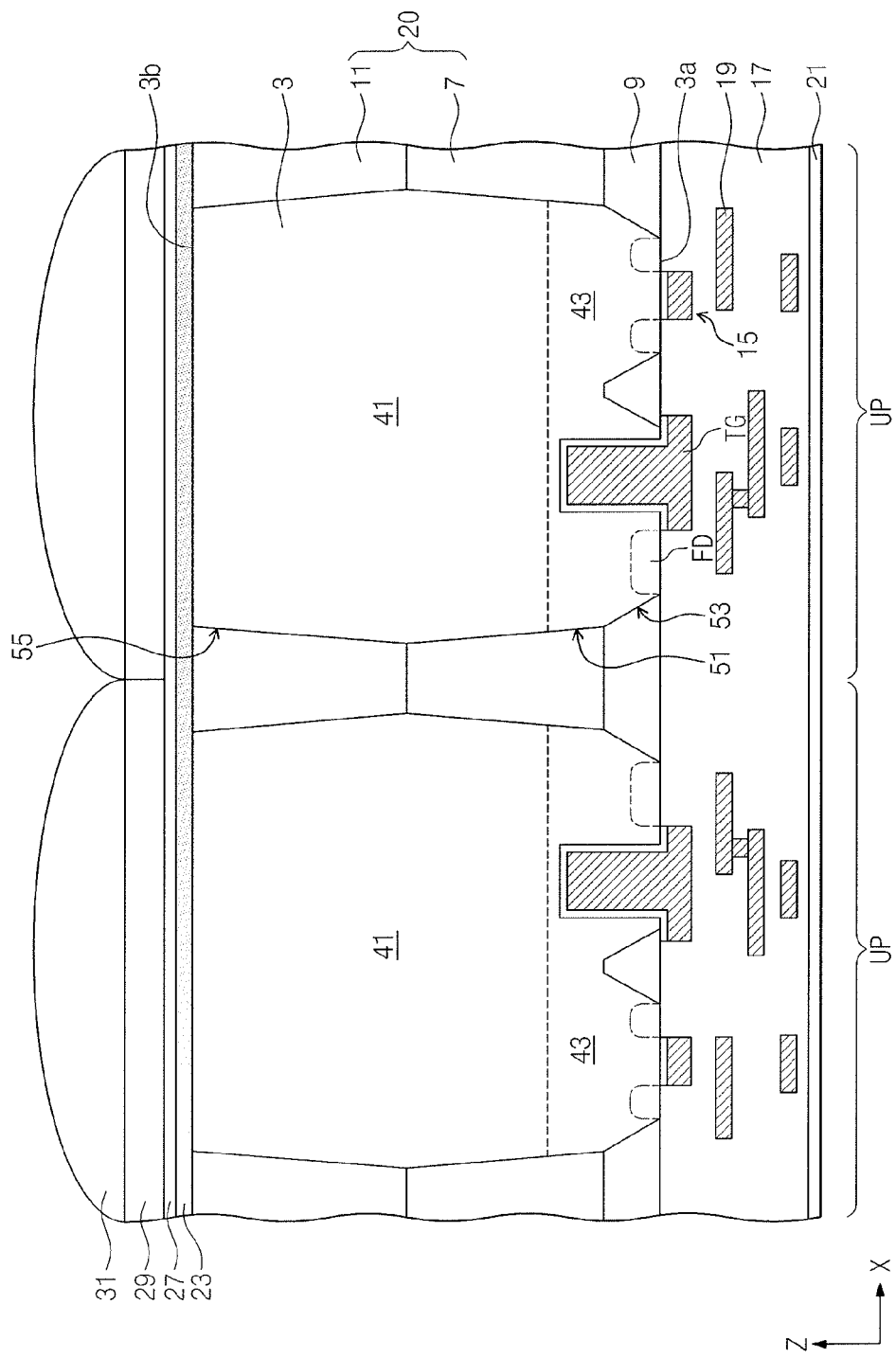

Referring to FIG. 12E, sidewalls of the shallow, first deep, and second deep trench isolation layers 9, 7, and 11 may be inclined in an image sensor according to this modified embodiment. A lower corner of the first deep trench isolation layer 7 may contact an upper corner of the shallow trench isolation layer 9. Also, gradient of the sidewall of the shallow trench isolation layer 9, a gradient of the sidewall of the first deep trench isolation layer 7, and a gradient of the sidewall of the second trench isolation layer 11 may be equal to or different from each other. Other elements and/or other fabricating processes of the image sensor according to the present modified embodiment may be the same as or similar to corresponding elements and corresponding fabricating processes of the image sensor described with reference to FIG. 12D.

Figure 13:
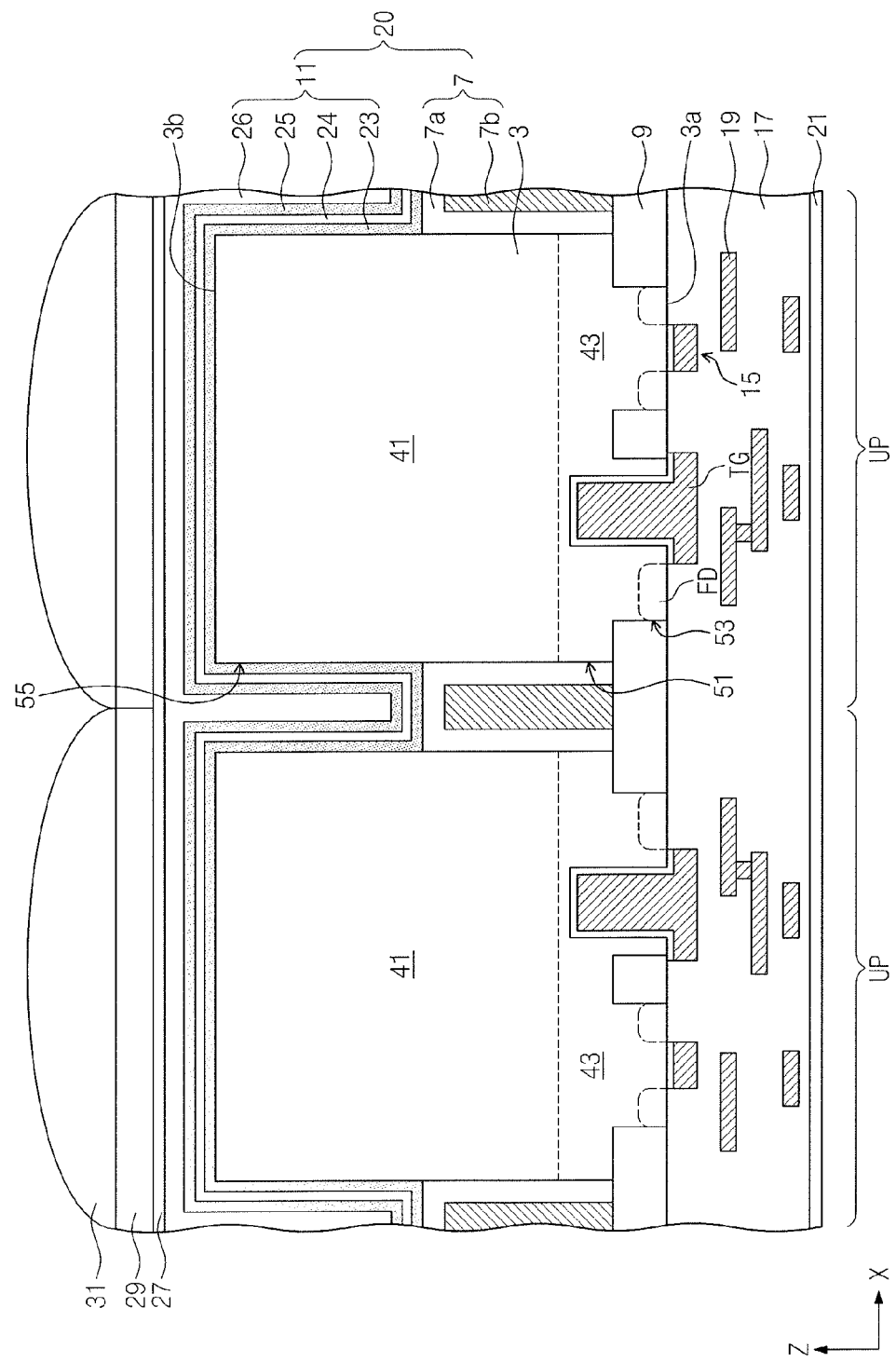
FIG. 13 illustrates another embodiment of an image sensor.

FIG. 13 is a cross-sectional view illustrating another embodiment of an image sensor. Referring to FIG. 13, in the image sensor of this embodiment, a first deep trench isolation layer 7 may include a first filling insulation layer 7a and a poly-silicon pattern 7b. The first filling insulation layer 7a may conformally cover a sidewall and a bottom surface of the first deep trench 51. The poly-silicon pattern 7b may fill the first deep trench 51. The poly-silicon pattern 7b may be doped with N-type dopants. The first filling insulation layer 7a may include a silicon oxide-based material. Since a thermal expansion coefficient of the poly-silicon pattern 7b is approximately equal to that of silicon of the substrate 3, it is possible to reduce a physical stress caused by a difference between thermal expansion coefficients of materials of the an image sensor.

A second deep trench isolation layer 11 may include a fixed charge layer 23, an oxygen permeation preventing layer 24, a gap-fill supplementary layer 25, and a second filling insulation layer 26 which are sequentially and conformally formed on a sidewall and a bottom surface of the second deep trench 55. The fixed charge layer 23 may be the same as or similar to the fixed charge layer 23 described with reference to FIG. 3. The second filling insulation layer 26 may include a silicon oxide-based material. The oxygen permeation preventing layer 24 may include, for example, a silicon nitride-based material. The oxygen permeation preventing layer 24 may prevent oxygen from being supplied to the fixed charge layer 23 when the second filling insulation layer 26 is formed.

Since the fixed charge layer 23 may include an oxygen-poor metal oxide, it may have negative fixed charges. If the oxygen permeation preventing layer 24 does not exist, oxygen may be combined with the metal oxide of the fixed charge layer 23 during the formation of the second filling insulation layer 26. Thus, the fixed charge layer 23 may lose the function having the negative fixed charges. The gap-fill supplementary layer 25 may include, for example, a hafnium oxide layer. The gap-fill supplementary layer 25 may improve a gap-fill characteristic of the second filling insulation layer 26.

The fixed charge layer 23, the oxygen permeation preventing layer 24, the gap-fill supplementary layer 25, and the second filling insulation layer 26 which constitute the second deep trench isolation layer 11 may extend onto the second surface 3b. In the present embodiment, since the fixed charge layer 23 surrounds a top surface and a sidewall of the first dopant injection region 41, the dark current characteristic may be improved more significantly. Other elements of the image sensor according to the present embodiment may be the same as or similar to corresponding elements of the image sensor described with reference to FIG. 3.

Figure 14:
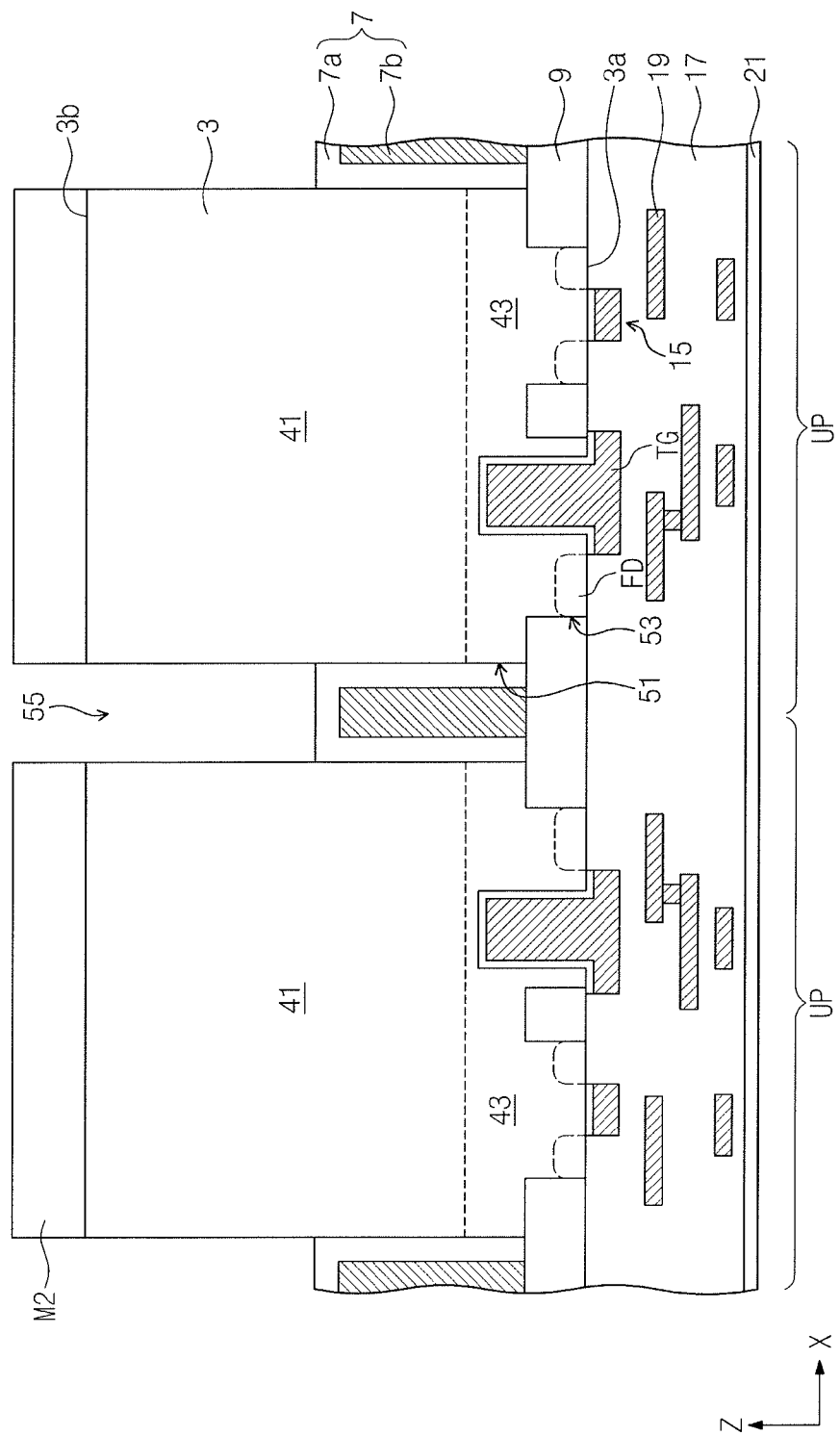
FIG. 14 illustrates a stage in an embodiment of a method for fabricating the image sensor of FIG. 13.

FIG. 14 is a cross-sectional view illustrating a stage in an embodiment of a method for fabricating the image sensor of FIG. 13. Referring to FIG. 14, a first filling insulation layer 7a may be conformally formed and a poly-silicon layer may be formed to fill the first trench 51 when the first deep trench isolation layer 7 is formed in FIG. 6, e.g., before the substrate is rotated. Thereafter, a planarization etching process may be performed on the first filling insulation layer 7a and the poly-silicon layer to leave the first filling insulation layer 7a and a poly-silicon pattern 7b in the first deep trench 51.

When the shallow trench 53 is formed, the first filling insulation layer 7a and the poly-silicon pattern 7b may also be etched. A shallow trench isolation layer 53 may be formed in the shallow trench 53. The processes described with reference to FIGS. 8 and 9 may be performed, and, then, a second mask pattern M2 may be formed on the second surface 3b. The substrate 3 may be etched using the second mask pattern M2 as an etch mask to form a second deep trench 55 exposing the first deep trench isolation layer 7. At this time, a top surface of the first filling insulation layer 7a may be exposed.

Referring again to FIG. 13, the fixed charge layer 23, the oxygen permeation preventing layer 24, the gap-fill supplementary layer 25, and the second filling insulation layer 26 may be sequentially and conformally formed to form the second deep trench isolation layer 11 filling the second deep trench 55. The second passivation layer 27, the color filter 29, and the micro-lens 31 may be sequentially formed on the second filling insulation layer 26. Other fabricating processes of the present embodiment may be the same as or similar to corresponding processes of the embodiment described with reference to FIGS. 4 to 11.

Figure 15:
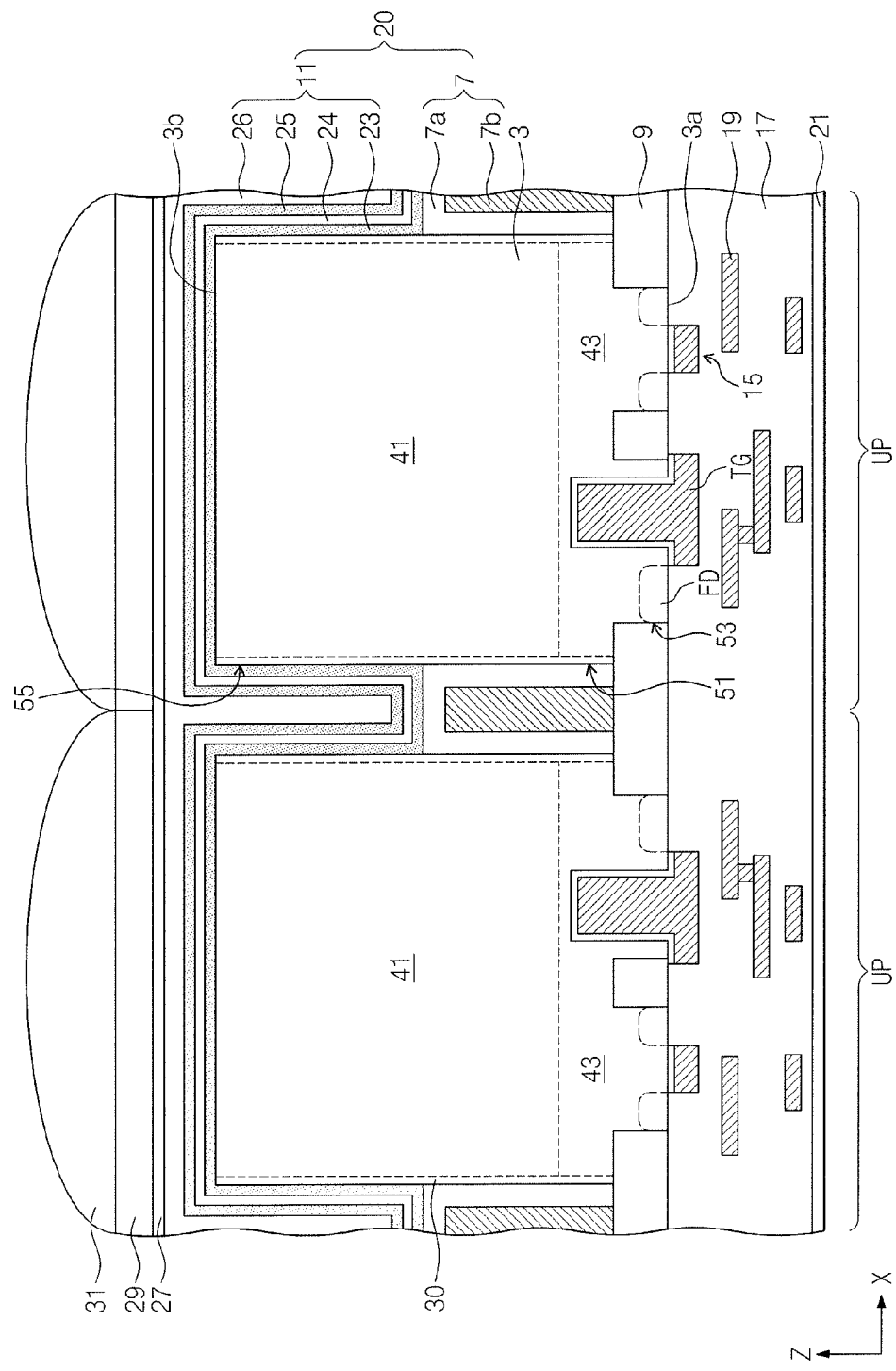
FIG. 15 illustrates another embodiment of an image sensor.

FIG. 15 is a cross-sectional view illustrating another embodiment of an image sensor. Referring to FIG. 15, in the image sensor according to this embodiment, a third dopant injection region 30 may be disposed in the substrate 3 adjacent to the sidewalls of the first and second deep trenches 51 and 55. The third dopant injection region 30 may extend along the sidewalls of the first and second deep trenches 51 and 55. The third dopant injection region 30 may be doped with dopants have a conductivity type that is the same as that of the dopants included in the second dopant injection region 43. For example, the third dopant injection region 30 may be doped with P-type dopants. The dopant concentration of the third dopant injection region 30 may be higher than that of the second dopant injection region 43. Other elements of the image sensor according to this embodiment may be the same as or similar to corresponding elements of the image sensor described with reference to FIG. 13.

In a method for fabricating the image sensor according to the present embodiment, a tilt ion implantation process may be performed after each of the first and second deep trenches 51 and 55 is formed, thereby forming the third dopant injection region 30. Other fabricating processes of the present embodiment may be the same as or similar to corresponding processes of the embodiment described with reference to FIG. 14.

Figure 16:
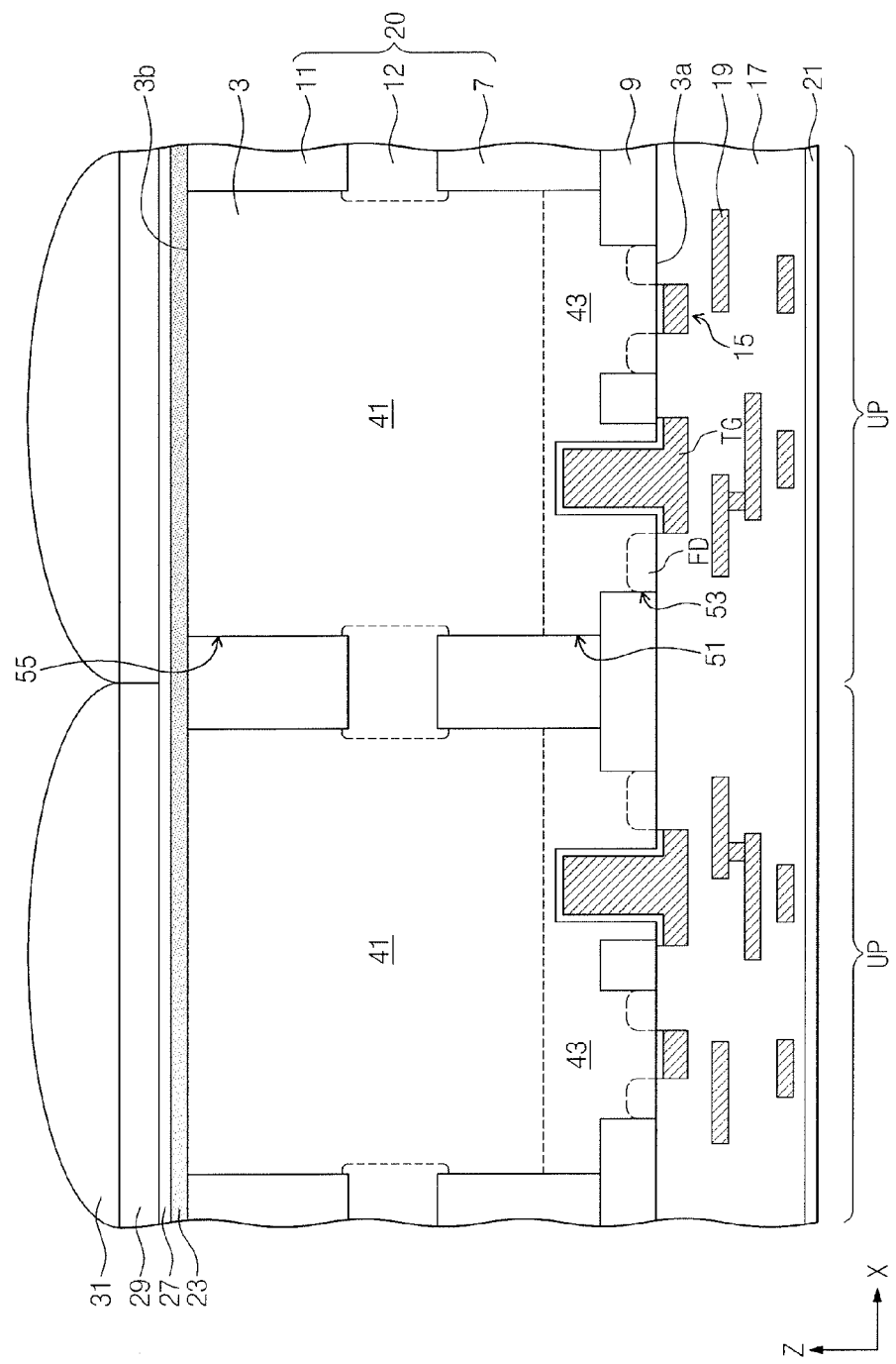
FIG. 16 illustrates another embodiment of an image sensor.

FIG. 16 is a cross-sectional view illustrating another embodiment of an image sensor. Referring to FIG. 16, in the image sensor according to this embodiment, a deep trench isolation region 20 may include a first deep trench isolation layer 7, a second deep trench isolation layer 11, and a channel stop region 12 disposed between the first and second deep trench isolation layers 7 and 11. The first deep trench isolation layer 7 is spaced apart from the second deep trench isolation layer 11. The channel stop region 12 may be doped with dopants having a conductivity type that is the same as that of the dopants included in the second dopant injection region 43. For example, the channel stop region 12 may be doped with P-type dopants. The dopant concentration of the channel stop region 12 may be higher than that of the second dopant injection region 43. Other elements of the image sensor according to the present embodiment may be the same as or similar to corresponding elements of the image sensor described with reference to FIG. 3.

Figure 17:
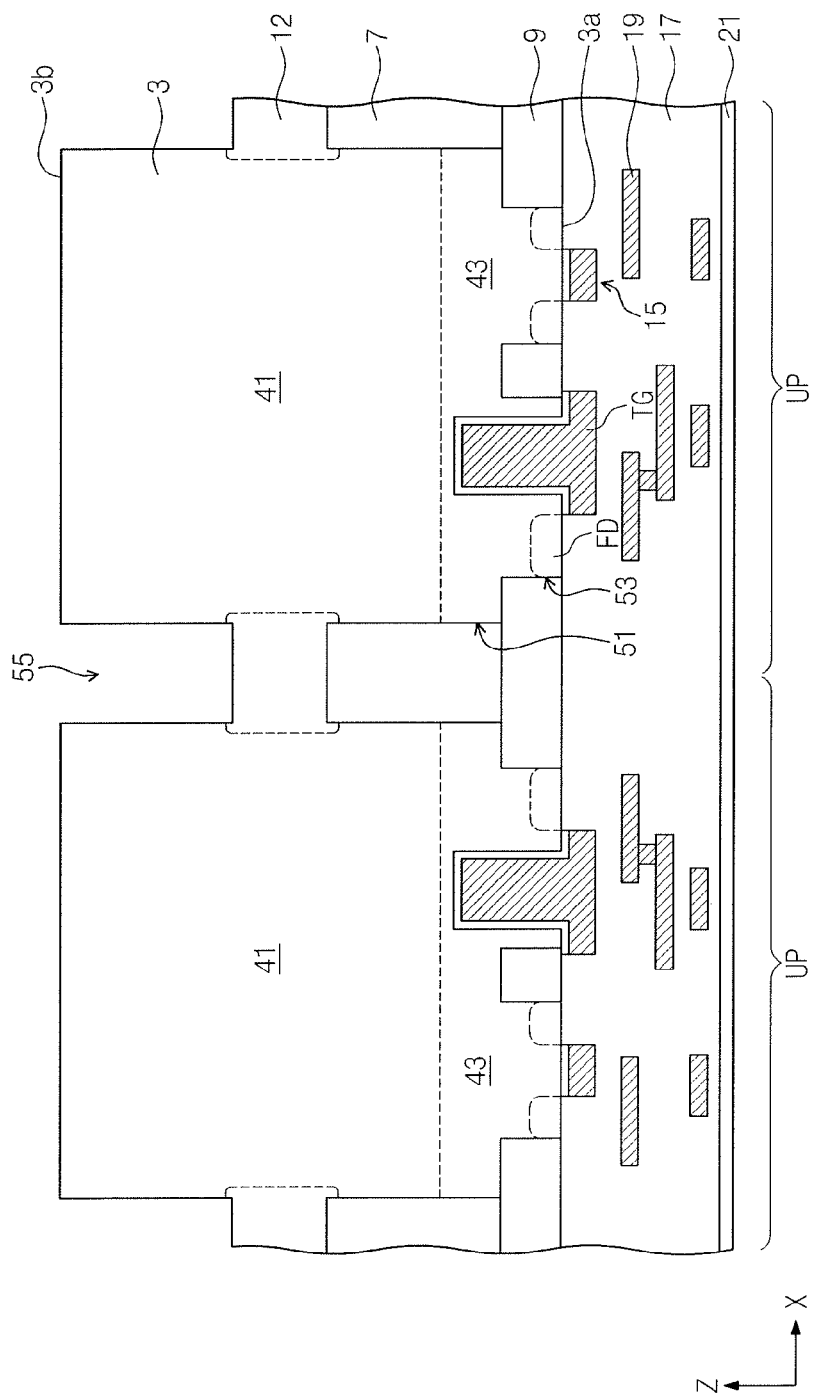
FIG. 17 illustrates a stage in an embodiment of a method for fabricating the image sensor of FIG. 16.

FIG. 17 is a cross-sectional view illustrating a stage in an embodiment of a method for fabricating the image sensor of FIG. 16. Referring to FIG. 17, an ion implantation process may be performed to form a channel stop region 12 under a bottom surface of the first deep trench 51 after the first deep trench 51 is formed in FIG. 5. The ion implantation process may be performed in a third direction Z substantially perpendicular to the first surface 3a of the substrate 3. The processes described with reference to FIGS. 6 to 9 may be performed, and, then, a second deep trench 55 may be formed. At this time, the second deep trench 55 may be spaced apart from the first deep trench isolation layer 7 and may expose the channel stop region 12. Subsequent processes to be performed thereafter may be the same as or similar to the processes described with reference to FIG. 11.

Figure 18:
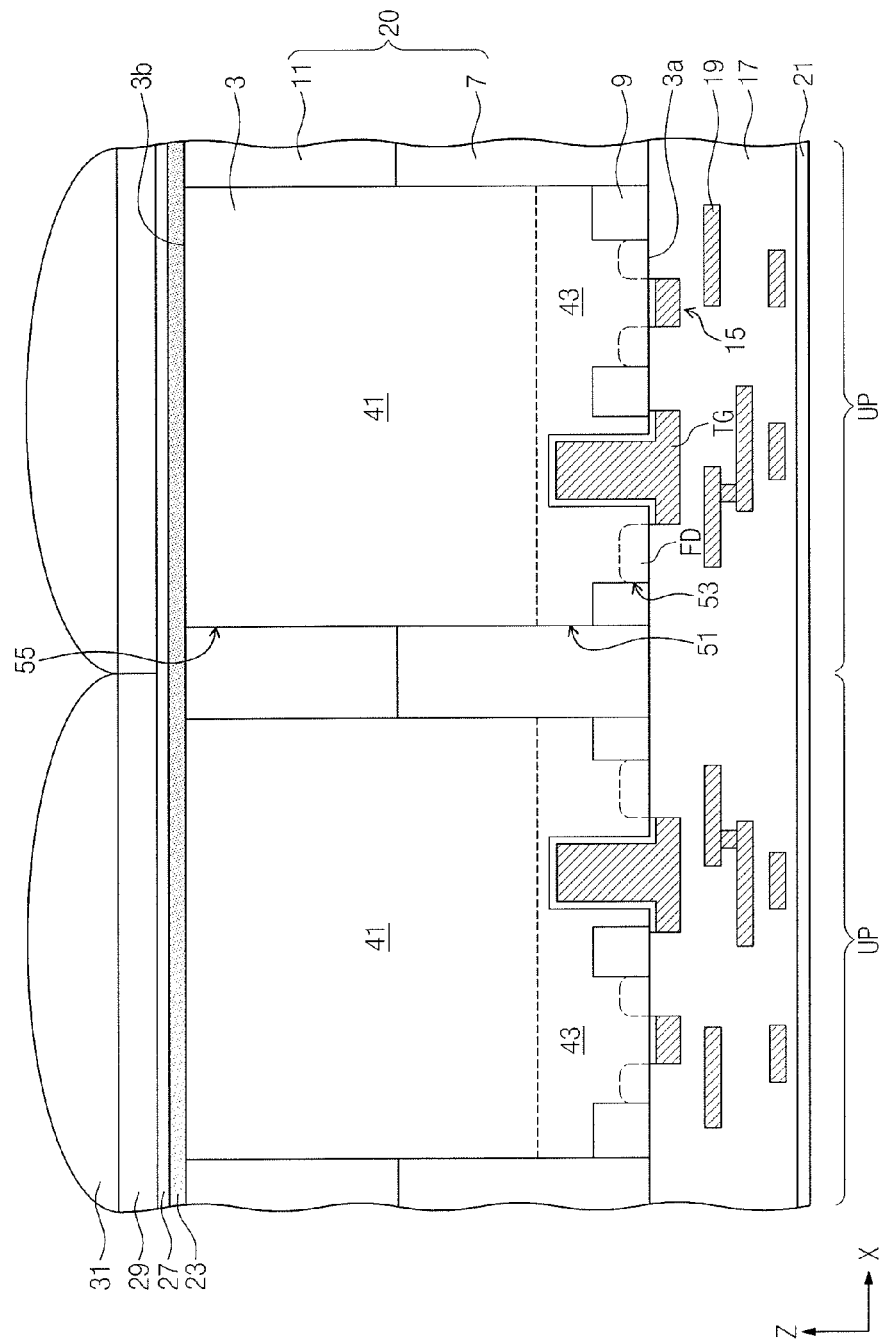
FIG. 18 illustrates another embodiment of an image sensor.

FIG. 18 is a cross-sectional view illustrating another embodiment of an image sensor. Referring to FIG. 18, in this embodiment, a deep trench isolation region 20 may penetrate the substrate 3 so as to be connected to the first surface 3a and the second surface 3b. For example, a top surface of a first deep trench isolation layer 7 may be coplanar with the first surface 3a. Other elements of the image sensor according to the present embodiment may be the same as or similar to corresponding elements of the image sensor described with reference to FIG. 3.

The order of the formation of the shallow trench isolation layer 9 and the first deep trench isolation layer 7 may be changed to fabricate the image sensor of FIG. 18. For example, the shallow trench isolation layer 9 may be first formed through the first surface 3a. Next, the shallow trench isolation layer 9 disposed at the boundary of the unit pixel regions UP and the substrate 3 may be successively etched to form a first deep trench 51. Thereafter, the first deep trench isolation layer 7 may be formed to fill the first deep trench 51. Other fabricating processes of the present embodiment may be the same as or similar to corresponding processes of the embodiment described with reference to FIGS. 4 to 11.

Figure 19:
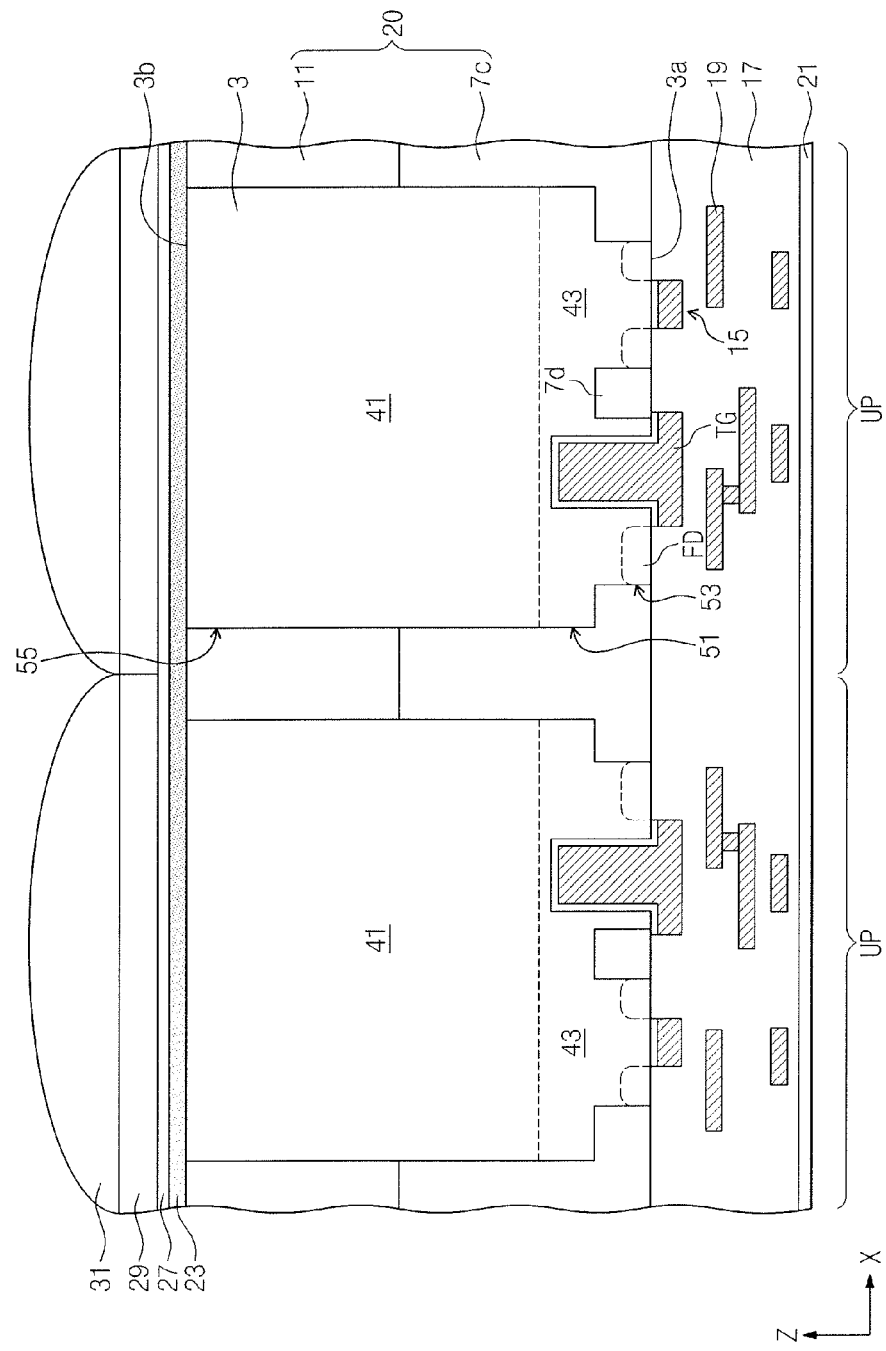
FIG. 19 illustrates another embodiment of an image sensor.

FIG. 19 is a cross-sectional view illustrating another embodiment of an image sensor. Referring to FIG. 19, in the present embodiment, a shallow trench isolation layer disposed at the boundary of the unit pixel regions UP and a first deep trench isolation layer 7c may constitute one united body. Thus, the first deep trench isolation layer 7c may have a T-shaped cross section. A deep trench isolation region 20 may penetrate the substrate 3 so as to be connected to the first surface 3a and the second surface 3b. A shallow trench isolation layer 7d, that is spaced apart from the first deep trench isolation layer 7c, may have the same shape as the shallow trench isolation layer 9 illustrated in FIG. 3. Other elements of the image sensor according to the present embodiment may be the same as or similar to corresponding elements of the image sensor described with reference to FIG. 3.

Figure 20:
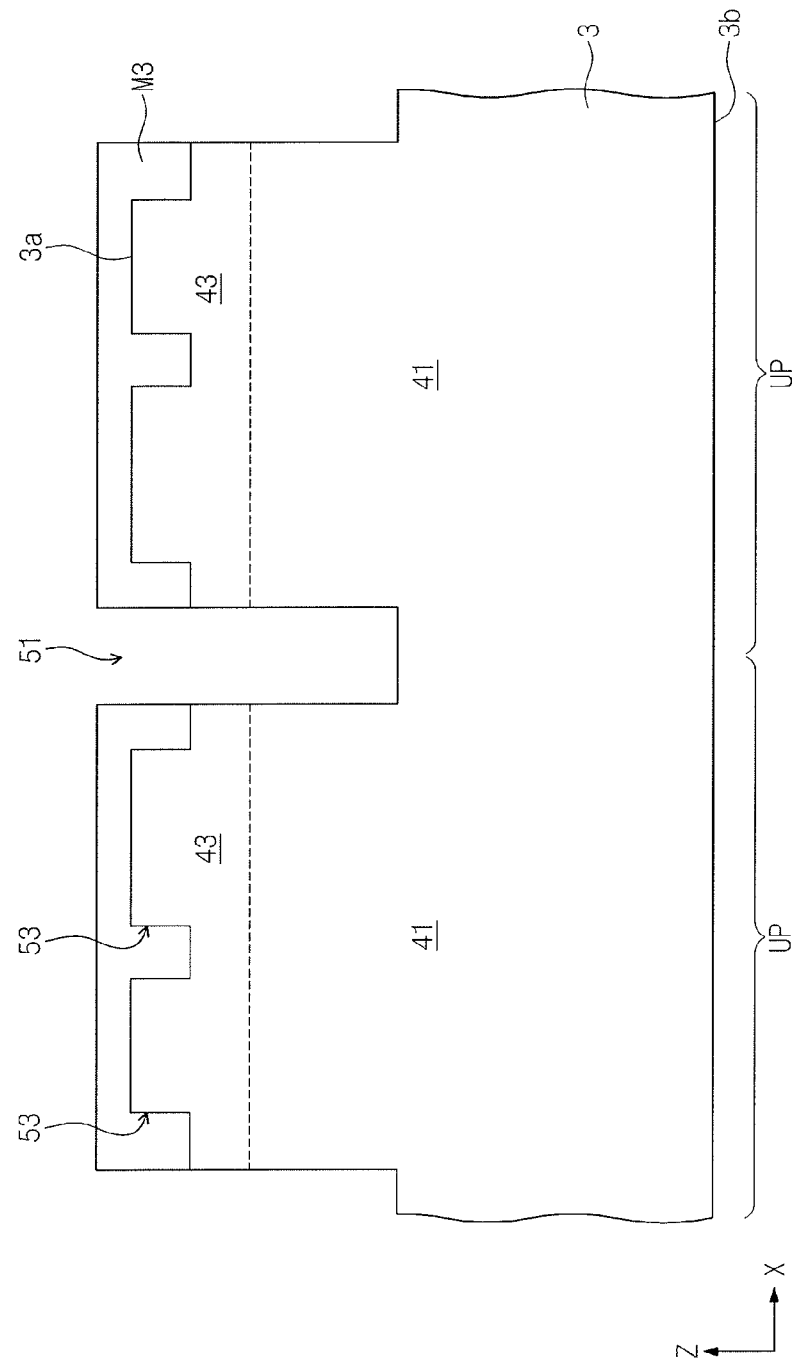
FIG. 20 illustrates a stage in an embodiment of a method for fabricating the image sensor of FIG. 19.

FIG. 20 is a cross-sectional view illustrating a stage in an embodiment of a method for fabricating the image sensor of FIG. 19. Referring to FIG. 20, shallow trenches 53 defining active regions AR may be formed in the substrate 3 through the first surface 3a. Thereafter, a third mask pattern M3 defining a first deep trench 51 may be formed on the first surface 3a. The third mask pattern M3 may partially fill the shallow trenches 53. The substrate 3 may be etched using the third mask pattern M3 as an etch mask to form a first deep trench 51 under a bottom surface of the shallow trench 53 disposed at the boundary of the unit pixel regions UP. Subsequently, the third mask pattern M3 is removed. Thus, the shallow trenches 53 and the first deep trench 51 are formed.

The first deep trench 51 and the shallow trench 53 adjacent thereto may form a dual damascene hole shape. An insulating layer may be formed to fill the shallow trenches 53 and the first deep trench 51. A planarization etching process may be performed on the insulating layer to form the shallow trench isolation layer 7d and the first deep trench isolation layer 7c, which are illustrated in FIG. 19. Other processes of the present embodiment may be the same as or similar to corresponding processes of the embodiment described with reference to FIGS. 4 to 11.

Figure 21:
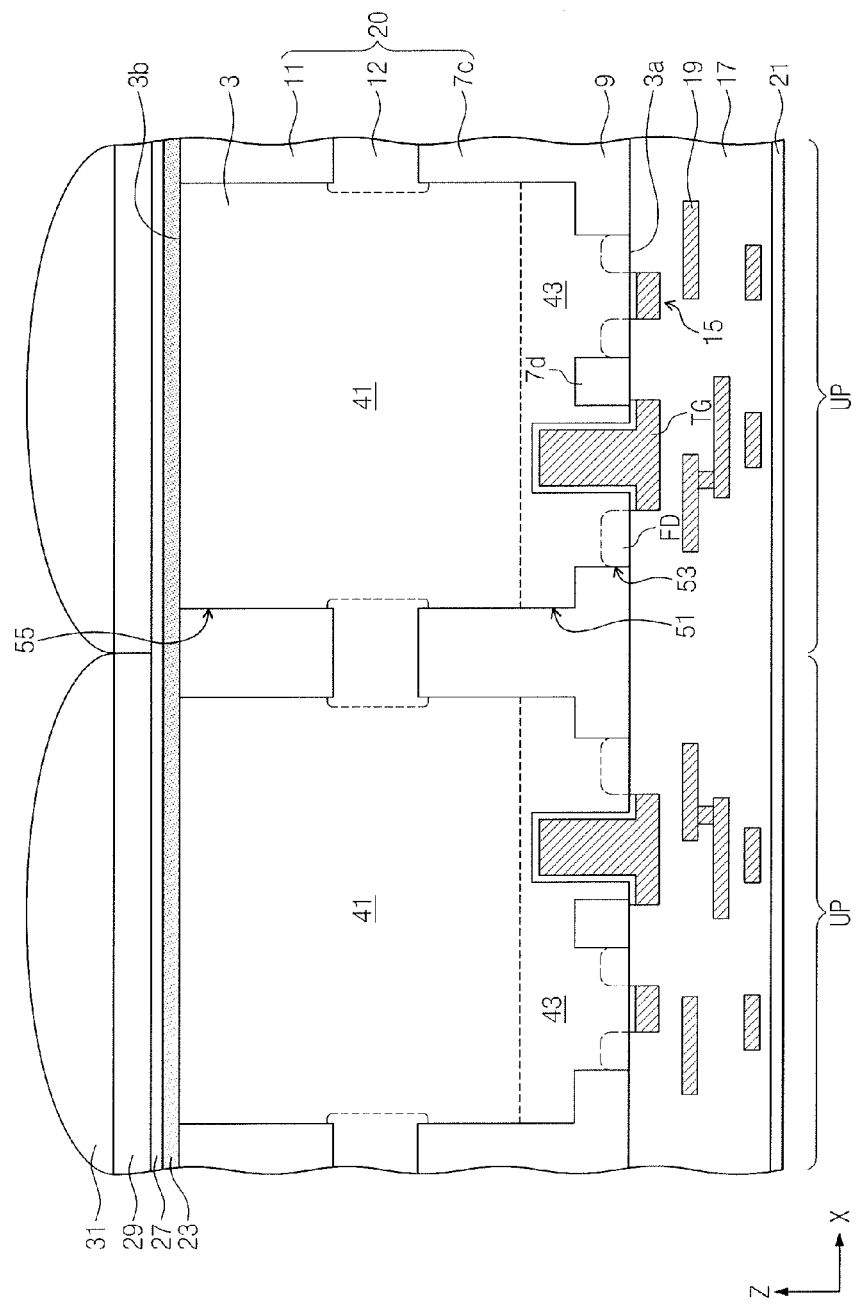
FIG. 21 illustrates another embodiment of an image sensor.

FIG. 21 is a cross-sectional view illustrating another embodiment of an image sensor. Referring to FIG. 21, in this embodiment, a deep trench isolation region 20 may include a first deep trench isolation layer 7c adjacent to the first surface 3a, a second deep trench isolation layer 11 adjacent to the second surface 3b, and a channel stop region 12 disposed between the first and second deep trench isolation layers 7c and 11. The first deep trench isolation layer 7c may be the same as or similar to the first deep trench isolation layer described with reference to FIG. 19. The channel stop region 12 may be the same as or similar to the channel stop region 12 described with reference to FIG. 16.

Figure 22:
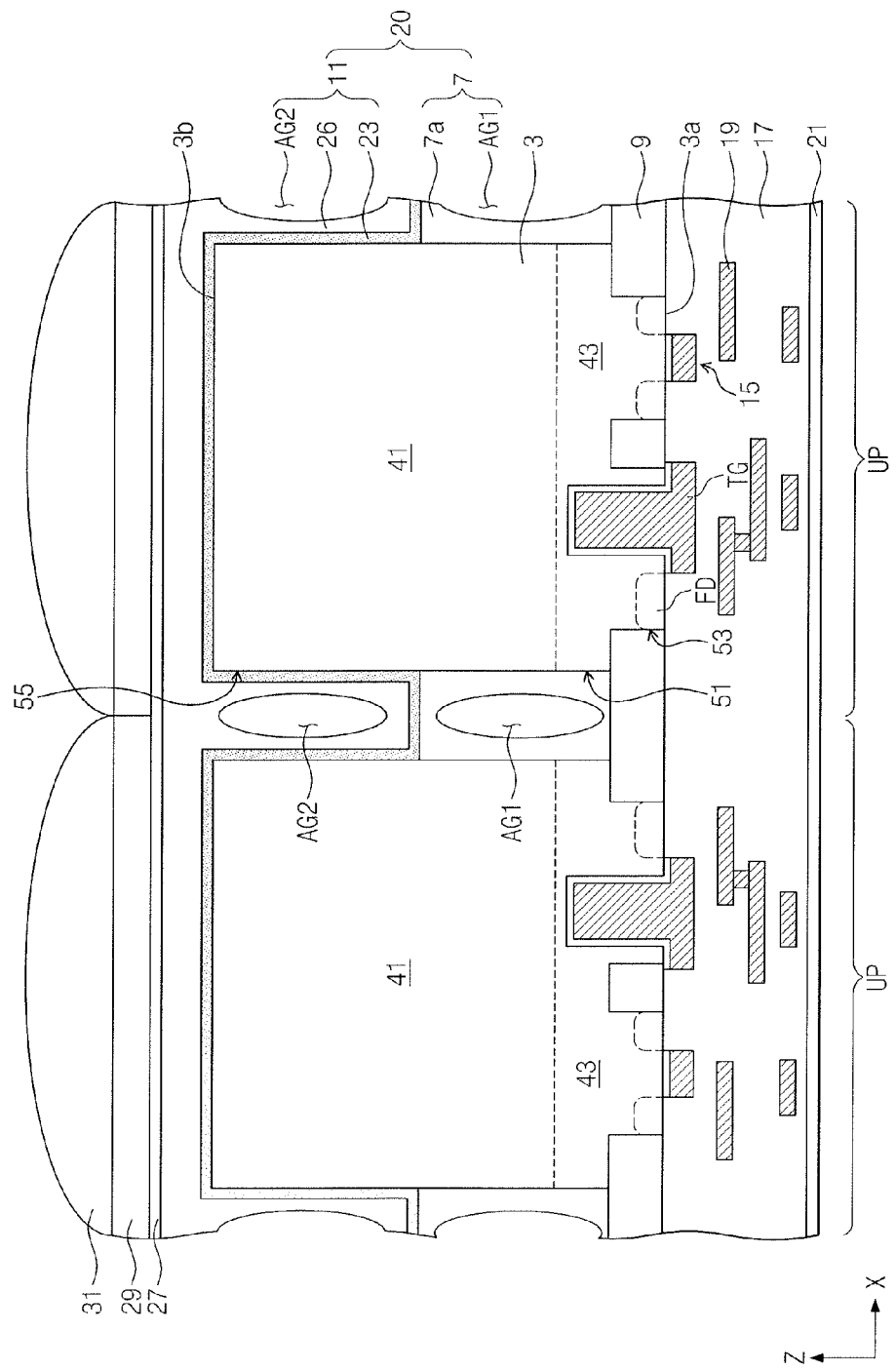
FIG. 22 illustrates another embodiment of an image sensor.

FIG. 22 is a cross-sectional view illustrating another embodiment of an image sensor. Referring to FIG. 22, in this embodiment, a first deep trench isolation layer 7 may include a first filling insulation layer 7a and a first air gap region AG1 formed within the first filling insulation layer 7a. A second deep trench isolation layer 11 may include a fixed charged layer 23, a second filling insulation layer 26, and a second air gap region AG2 formed within the second filling insulation layer 26. At this time, the second filling insulation layer 26 may include a silicon nitride-based material to prevent the function of the fixed charge layer 23 from being deteriorated.

Figure 23:
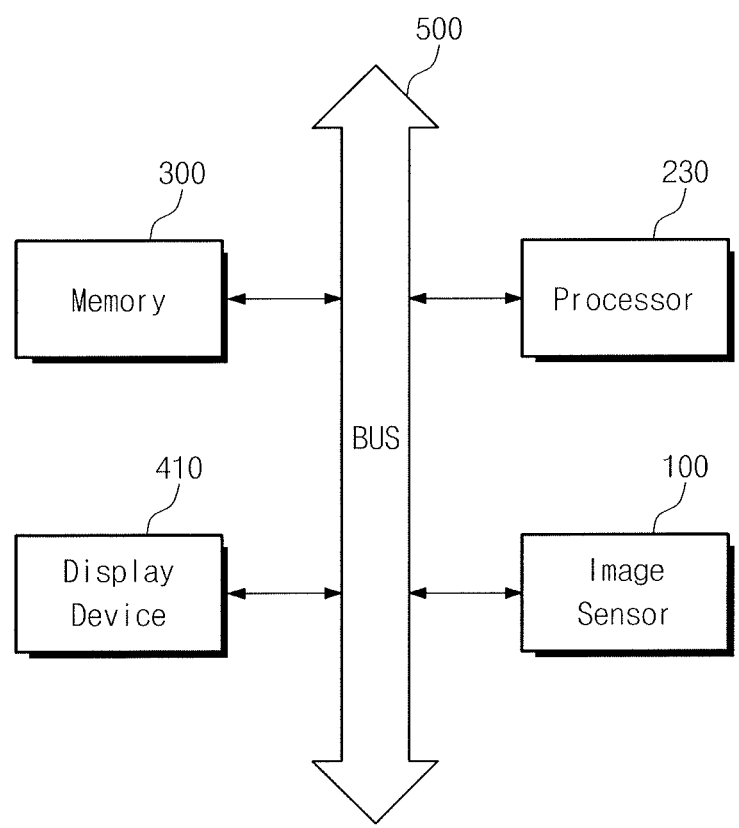
FIG. 23 illustrates an embodiment of an electronic device.

FIG. 23 illustrates an embodiment of an electronic device which may include an image sensor in accordance with one or more of the aforementioned embodiments. The electronic device may be a digital camera, a mobile device, or another electronic system or apparatus.

Referring to FIG. 23, the electronic device includes an image sensor 100, a processor 230, a memory device 300, a display device 410, and a data bus 500. As illustrated in FIG. 23, the image sensor 100 may capture external image information in response to one or more control signals of the processor 230. The processor 230 may store the captured image information in the memory device 300 through the data bus 500. The processor 230 may output the image information stored in the memory device 300 through the display device 410.

Figure 24:
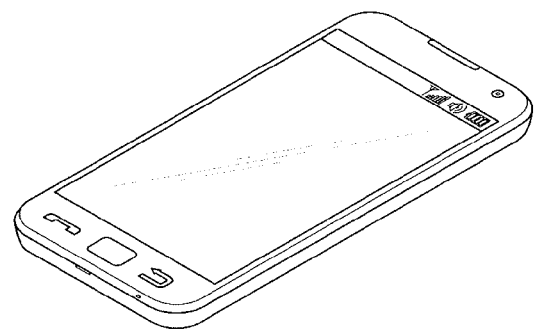
FIGS. 24 to 28 illustrate embodiments of multimedia devices.
Figure 25:
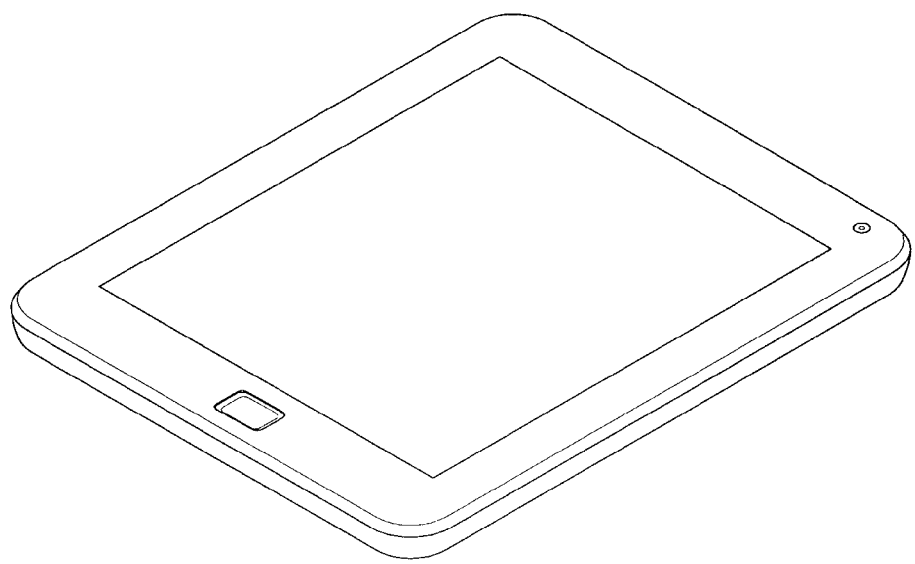

FIGS. 24 to 28 illustrate various embodiments of multimedia devices, each of which may include one or more of the aforementioned embodiments of an image sensor. The image sensor may be applied, for example, to various multimedia devices having an image photographing function. For example, the image sensor may be applied to a mobile or smart phone 2000 as illustrated in FIG. 24 and/or a tablet or smart tablet 3000 as illustrated in FIG. 25.

Figure 26:
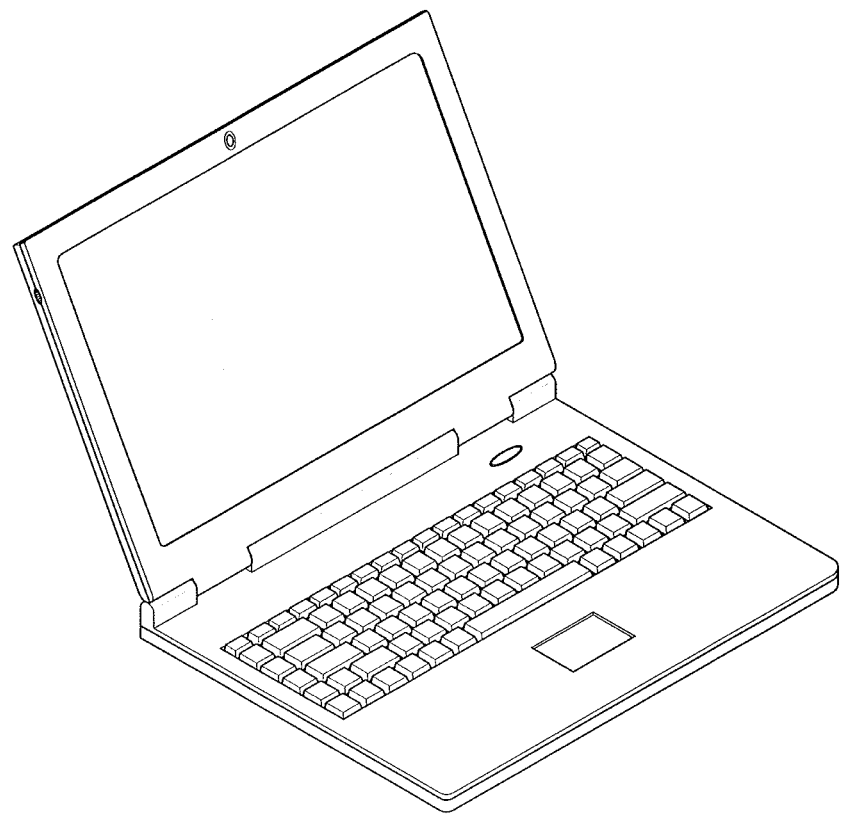
Figure 27:
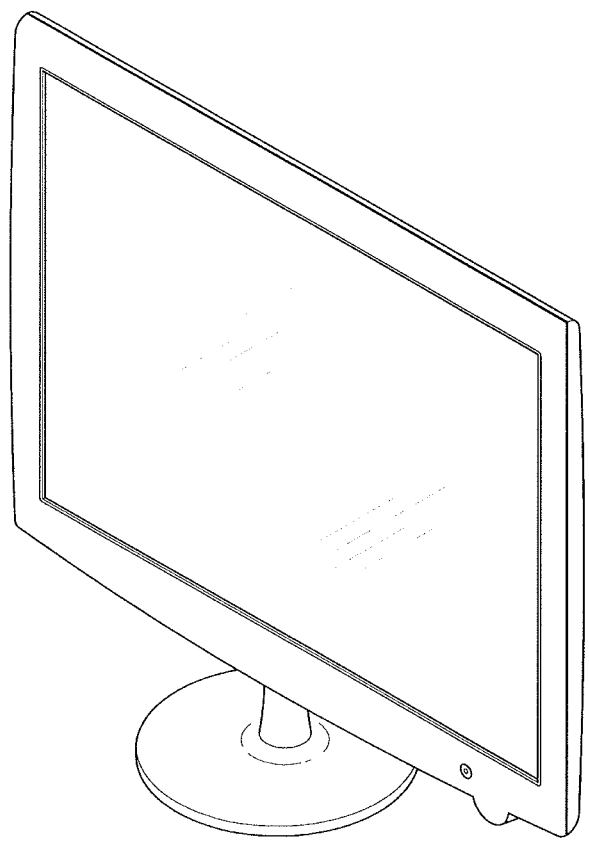
Figure 28:
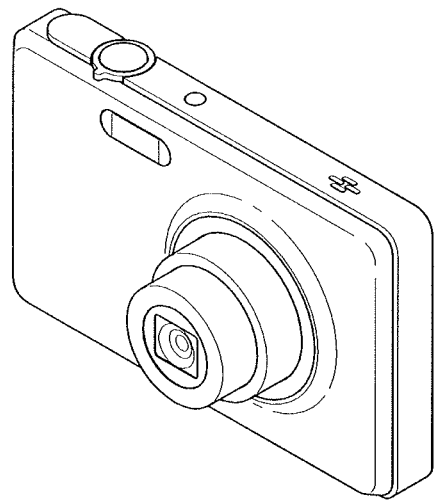

In addition, the image sensor may be applied to a notebook computer 4000 as illustrated in FIG. 26 and/or a television or smart television 5000 as illustrated in FIG. 27. Moreover, the image sensor may be applied to a digital camera or digital camcorder 6000 as illustrated in FIG. 28.

In accordance with one or more of the aforementioned embodiments, an image sensor includes the deep trench isolation portion which isolates unit pixel regions from each other, in order to reduce or eliminate cross-talk between adjacent pixels. In addition, the image sensor may include a fixed charge layer, which, for example, may have negative fixed charges. Thus, the holes may be accumulated in the neighborhood of the fixed charge layer. As a result, it is possible to effectively reduce the occurrence of dark current and white spots.

In these or other embodiments, a poly-silicon pattern may be disposed in the deep trench isolation layer. The thermal expansion coefficient of the poly-silicon pattern may be approximately equal to that of silicon of the substrate. As a result, it is possible to reduce physical stress caused by a difference between thermal expansion coefficients of materials in the image sensor.

In accordance with these or other embodiments, a method for fabricating an image sensor includes forming a first deep trench by etching a first surface of a substrate, and a second deep trench by etching a second surface of the substrate. For example, a plurality of the etching processes may be performed to form the deep trench isolation portion. Thus, etched depths of the etching processes may be reduced in order to improve margins of the etching processes. In addition, the depths of the first and second deep trenches may be reduced to improve the gap-fill characteristics of the first and second deep trench isolation layers. As a result, reproducibility of multiple image sensors may be improved.

Furthermore, if a trench for a deep trench isolation portion is formed by one etching process, the depth of the trench may be very deep. Thus, the width of an upper portion of the trench may be substantially large to prevent a not-open phenomenon of the trench. As a result, it may be difficult to reduce the size of the deep trench isolation portion, e.g., it may be difficult to form a highly integrated image sensor. However, since the deep trench isolation portion is formed using two etching processes, the width of the deep trench isolation portion may be relatively reduced. As a result, it is possible to easily realize a highly integrated image sensor.

The aforementioned embodiments may be combined in various combinations to form additional embodiments.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

We claim:

1. An image sensor, comprising:
   a substrate including a first surface, a second surface opposing the first surface, and a plurality of unit pixel regions;
   a shallow trench isolation layer adjacent to the first surface;
   a first deep trench isolation layer adjacent to the shallow trench isolation layer and extending toward the second surface in the substrate; and
   a second deep trench isolation layer adjacent to the second surface and vertically overlapping the first deep trench isolation layer, wherein the first and second deep trench isolation layers isolate the unit pixel regions from each other.

2. The image sensor as claimed in claim 1, wherein the first deep trench isolation layer is in contact with the second deep trench isolation layer.

3. The image sensor as claimed in claim 1, wherein the first deep trench isolation layer includes:
   a filling insulation layer; and
   a poly-silicon pattern in the filling insulation layer.

4. The image sensor as claimed in claim 1, further comprising:
   a dopant injection region in the substrate and along sidewalls of the first and second deep trench isolation layers.

5. The image sensor as claimed in claim 1, wherein the second deep trench isolation layer includes:
   a fixed charge layer; and
   a filling insulation layer in the fixed charge layer.

6. The image sensor as claimed in claim 5, wherein the fixed charge layer overlaps the second surface.

7. The image sensor as claimed in claim 1, wherein a sidewall of the second deep trench isolation layer is horizontally spaced apart from a sidewall of the first deep trench isolation layer.

8. The image sensor as claimed in claim 1, wherein
   the first deep trench isolation layer is vertically spaced apart from the second deep trench isolation layer, and
   the image sensor includes a channel stop region between the first deep trench isolation layer and the second deep trench isolation layer.

9. The image sensor as claimed in claim 1, wherein at least one of the first or second deep trench isolation layers includes an air gap region.

10. The image sensor as claimed in claim 1, wherein the first and second deep trench isolation layers surrounds each of the unit pixel regions when viewed from a plan view.

11. The image sensor as claimed in claim 1, wherein a width of the first deep trench isolation layer is different from a width of the second deep trench isolation layer.

12. The image sensor as claimed in claim 1, wherein a vertical length of the first deep trench isolation layer is different from a vertical length of the second deep trench isolation layer.

13. An image sensor, comprising:
   a substrate including a first surface, a second surface opposing the first surface, and a plurality of unit pixel regions;
   a first deep trench isolation layer adjacent to the first surface; and extending toward the second surface in the substrate; and a second deep trench isolation layer adjacent to the second surface, wherein the second deep trench isolation layer overlaps the first deep trench isolation layer when viewed from a plan view and wherein the first and second deep trench isolation layers isolate the unit pixel regions from each other.

14. The image sensor as claimed in claim 13, wherein the first deep trench isolation layer has substantially a T-shaped cross section.

15. An image sensor, comprising:
a first pixel region;
a second pixel region;
a fixed charge layer over the first and second pixel regions;
a first isolation layer between the first and second pixel regions; and
a second isolation layer between the first and second pixel regions, wherein the second isolation layer overlaps the first isolation layer and wherein the first and second isolation layers isolate the first pixel region from the second pixel region.

16. The image sensor as claimed in claim 15, wherein the fixed charge layer includes a material to induce accumulation of holes adjacent a surface of each of the first and second pixel regions.

17. The image sensor as claimed in claim 15, further comprising:
a poly-silicon pattern in the second isolation layer,
wherein the poly-silicon pattern has a first thermal expansion coefficient, the first and second pixel regions are in or on a layer having a second thermal expansion coefficient, and the first thermal expansion coefficient is substantially equal to the second thermal expansion coefficient.

18. The image sensor as claimed in claim 15, wherein the second isolation layer includes at least one of an oxygen permeation preventing layer or a filling insulation layer.

19. The image sensor as claimed in claim 15, wherein the second isolation layer includes:
a first layer; and
a second layer on the first layer,
wherein the first layer is closer to the first isolation layer than the second layer, and wherein the second layer is closer to a surface to receive incident light than the first layer.

20. The image sensor as claimed in claim 19, wherein:
the first layer includes one or more materials, and
the second layer includes one or more materials different from the one or more materials of the first layer.

* * * * *